(12) United States Patent
Hayashi et al.

(10) Patent No.: US 6,440,324 B1
(45) Date of Patent: Aug. 27, 2002

(54) METHOD FOR MANUFACTURING PIEZOELECTRIC CERAMIC COMPOSITION, PIEZOELECTRIC RESONATOR, PIEZOELECTRIC TRANSFORMER AND PIEZOELECTRIC ACTUATOR, AND PIEZOELECTRIC LAMINATED SINTERED BODY

(75) Inventors: Koichi Hayashi, Shiga-ken; Akira Ando, Omihachiman; Toshikatsu Hisaki, Shiga-ken; Yuji Yoshikawa, Hikone; Masanori Kimura, Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 35 days.

(21) Appl. No.: 09/648,441

(22) Filed: Aug. 25, 2000

(30) Foreign Application Priority Data

| Aug. 25, 1999 | (JP) | 11-238103 |
|---|---|---|
| Aug. 25, 1999 | (JP) | 11-238104 |
| Aug. 25, 1999 | (JP) | 11-238105 |
| Aug. 25, 1999 | (JP) | 11-238106 |
| Jul. 31, 2000 | (JP) | 2000-231619 |
| Aug. 10, 2000 | (JP) | 2000-242883 |

(51) Int. Cl.$^7$ .............................................. C04B 35/48
(52) U.S. Cl. ........................ 252/62.9 PZ; 501/134; 501/135; 501/136
(58) Field of Search .................................. 501/134, 135, 501/136; 252/62.9 PZ

(56) References Cited

U.S. PATENT DOCUMENTS 3,899,435 A * 8/1975 Minai et al. .......... 252/62.9 PZ

FOREIGN PATENT DOCUMENTS

| JP | 551537768 A | 11/1980 |
| JP | 59105210 A | 6/1984 |
| JP | 62-241825 | * 10/1987 |
| KR | 9312002 B1 | 12/1993 |

* cited by examiner

Primary Examiner—C. Melissa Koslow
(74) Attorney, Agent, or Firm—Dickstein, Shapiro, Morin & Oshinsky, LLP.

(57) ABSTRACT

A piezoelectric ceramic composition capable of obtaining a piezoelectric member that can provide a sufficient sintering density even by firing at a low temperature besides only allowing small amount of Pb to be evaporated by firing to reduce deterioration of electrical characteristics, wherein the piezoelectric member comprises a perovskite structure oxide of the piezoelectric ceramic composition containing Pb, Ti, Zr, Ma (Ma represents at least one of Cr, Mn, Fe and Co) and Md (Md represents at least one of Nb, Sb, Ta and W), and wherein a represents the total content (in mole) of Ma, and b, c, d and e (in mole) represent the contents of Sb, Nb, Ta and W, respectively, and $0.50<a/(b+c+d+2e)$.

19 Claims, 18 Drawing Sheets

METHOD FOR MANUFACTURING PIEZOELECTRIC CERAMIC COMPOSITION, PIEZOELECTRIC RESONATOR, PIEZOELECTRIC TRANSFORMER AND PIEZOELECTRIC ACTUATOR, AND PIEZOELECTRIC LAMINATED SINTERED BODY

BACKGROUND OF THE INVENTION

1. Field of the Invention

The present invention relates to a lead oxide based piezoelectric ceramic composition, for example to a piezoelectric ceramic composition to be used as a piezoelectric member in piezoelectric resonators, piezoelectric filters, piezoelectric transformers or piezoelectric actuators. The present invention also relates to a piezoelectric resonator, a piezoelectric transformer and a piezoelectric actuator using the piezoelectric ceramic composition.

2. Description of the Related Art $Pb(Ti, Zr)O_3$ based piezoelectric ceramics have been used for communication system filters, CPU clocks, actuators or sensors taking advantage of piezoelectric effects. Piezoelectric ceramics based on plural components such as $Pb(Ti, Zr)O_3$—$PB(Mn_{1/3}Sb_{2/3})O_3$ have been also used for improving electrical characteristics.

However, Pb has been apt to be evaporated as PbO by firing in the conventional $Pb(Ti, Zr)O_3$ based piezoelectric ceramics since they should be fired at a high temperature. Consequently, the electrical characteristics have been often deteriorated, or the electrical characteristics among the piezoelectric ceramics obtained showed a large distribution. In other words, a piezoelectric ceramic that can exhibit desired electric characteristics could not be securely manufactured, making it difficult to design various devices using the piezoelectric ceramics.

SUMMARY OF THE INVENTION

Accordingly, it is an object of the present invention to provide a piezoelectric ceramic composition for making it possible to obtain a piezoelectric member having small variation of electrical characteristics by suppressing evaporation of Pb by firing.

An another object of the present invention is to provide a piezoelectric resonator, piezoelectric transformed and piezoelectric actuator using the piezoelectric ceramic composition as hitherto described.

The present invention for solving the foregoing problems provides a piezoelectric ceramic composition with a perovskite structure of an oxide containing Pb, Ti, Zr, Ma (Ma denotes at least one of Cr, Mn, Fe and Co) and Md (Md denotes at least one of Nb, Sb, Ta and W), wherein z is within a range of $0.50 < z < 1.00$ with the proviso that the total content of Ma is a, and the contents of Sb, Nb, Ta and W of the elements Md are b, c, d and e, respectively, satisfying the relation of $a/(b+c+d+2e)=z$.

A part of Pb may be replaced by Ba, Ca, Sr, La, Nd and Ce within a range not to compromise the objects of the present invention. The elements of Ma and Md may be mingled with lead titanate zirconate to form a solid solution of a composite oxide, or they may be used as pure oxides.

Preferably, u in the perovskite structure represented by $A_u BO_3$ falls within a range of $0.98 \leq u \leq 1.02$ (wherein A is composed of a total of Pb and substituted elements when Pb or a part of Pb is replaced by Ba and the like, and B is composed of Ti, Zr, Ma and Md) in order to obtain better piezoelectric characteristics.

Preferably, x is within a range of $0.45 \leq x \leq 0.65$ with the proviso that the ratio of Ti and Zr is $x:(1-x)$ in order to obtain better piezoelectric characteristics.

It is also preferable that Si is added in a proportion of about 0.005 to 0.1% by weight when converted into $SiO_2$ relative to a combined proportion of 100% by weight of Pb, Ti, Zr, Ma and Md.

A piezoelectric member comprising the piezoelectric ceramic composition according to the present invention may be used for the piezoelectric resonator according to the present invention.

Also, a piezoelectric member comprising the piezoelectric ceramic composition according to the present invention may be used for the piezoelectric transformer according to the present invention.

Also, a piezoelectric member comprising the piezoelectric ceramic composition according to the present invention may be used for the piezoelectric actuator according to the present invention.

DESCRIPTION OF THE PREFERRED EMBODIMENTS

EXAMPLE 1

Respective powders of PbO, $TiO_2$, $ZrO_2$, $MnO_2$, $Sb_2O_5$ and $SiO_2$ were blended as starting materials so that the composition is represented by $\{0.95Pb(Zr_{1-x}Ti_x)O_3-0.05Pb(Mn_ySb_{1-y})O_3\}+v$ % by weight of $SiO_2$. Respective starting material powders as shown by the sample Nos. 1 to 27 in the following Tables 1 and 2 were prepared by variously changing the values of x, y and v. The molar ratio between Mn and Sb, or the ratio of a/(b+c+d+2e) in the present invention, is represented by $y/(1-y)$.

Water was added to each starting material powder prepared as described above, and the powder was pulverized and mixed with the water in a ball-mill in a wet state using cobblestones of stabilized zirconia as a pulverizing medium.

Each starting material powder prepared by mixing as described above was dehydrated by evaporation followed by calcination at a temperature of 700 to 900° C.

A PVA (polyvinyl acetate) based binder was added to and mixed with the calcinated starting material in a proportion of 1 to 5% by weight relative to the calcinated starting material.

The starting material mixed with the binder as described above was pressed at a pressure of 500 to 2000 $Kg/cm^2$ to obtain a disk-shaped molded body. The molded body was then fired at a temperature of 850 to 1250° C. to obtain a disk-shaped piezoelectric ceramic with a diameter of 10 mm and a thickness of 1 mm.

After forming silver electrodes on both faces of the piezoelectric ceramic by vacuum evaporation, a direct current electric field of 2.0 kV/mm to 5.0 kV/mm was applied in an insulation oil bath at a temperature of 60 to 150° C. in order to polarize the ceramic disk along the direction of thickness, thereby obtaining a disk-shaped piezoelectric resonator.

Piezoelectric characteristics of radial divergent vibration of the piezoelectric resonator obtained was assessed with an impedance analyzer. The results are shown in Tables 1 and 2.

The piezoelectric ceramics obtained from respective starting materials of the sample Nos. 2, 10, 11 and 25 with x=0.5 and v=0.02 are selected as representative examples of the piezoelectric resonators obtained by using respective starting materials of the sample Nos. 1 to 27.

Figure 1:
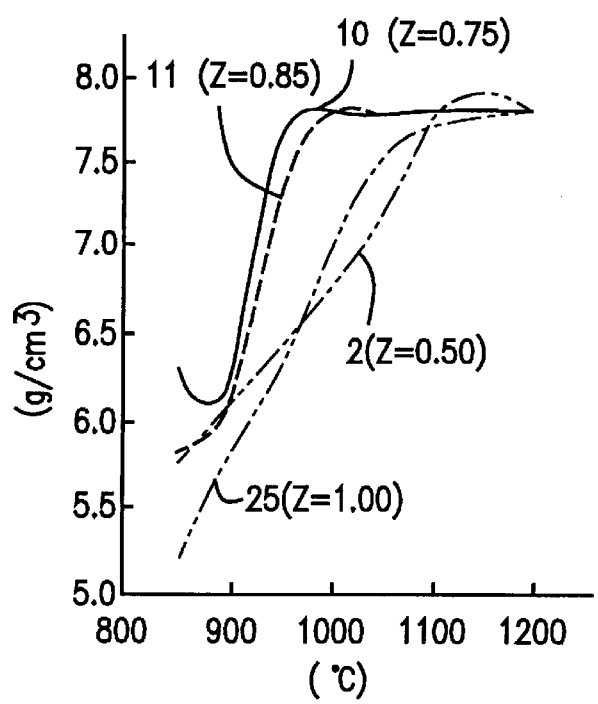
FIG. 1 shows the relation between the firing temperature of the piezoelectric ceramic composition and the sintering density of the piezoelectric member obtained when the molar ratio z of Mn/Sb in Example 1 is changed.

The relation between the firing temperature and sintering density of the selected piezoelectric ceramics is shown in FIG. 1.

It is evident that a ceramic with a sufficient sintering density cannot be obtained unless it is fired at a temperature exceeding 1100° C., when the starting material of the sample No. 2 with a molar ratio z of 0.50 is used.

A sufficient sintering density cannot be also obtained when the starting material of the sample No. 25 with a molar ratio z of 1.00 is used, unless it is fired at a temperature of as high as 1100° C. or more.

When the starting materials of the sample Nos. 10 and 11 corresponding to the embodiments of the present invention are used, on the contrary, the sintering density is sufficiently increased even when it is fired at a temperature of as low as about 940° C.

The results as described above were obtained because the boundary between the composition range where sintering properties are improved and the composition range where sintering properties are scarcely improved is so clear that a small difference in the composition close to the boundary composition causes a large difference in the sintering property.

Accordingly, it can be understood that the sintering property of the piezoelectric ceramic is largely improved by adjusting the molar ratio z of Mn/Sb to be larger than 0.50 and smaller than 1.00.

In all of the tables which follow, the term "E+N" (where N is a numerical value) in resistivity column denotes that the value is being expressed the number in front of the "E" times $10^N$. For example, the value for sample no. 1 in the Table 1 is set forth as 2.8 E+07 should be understood to mean $2.8×10^7$.

$(1-b)/2Sb_2O_5\}$. Respective starting material powders with the sample Nos. 28 to 38 shown in Table 3 below were prepared by variously changing the values of x, b and v. The molar ratio z of Mn and Sb is represented by $z=b/(1-b)$.

TABLE 1

$0.95\ PbZr_{(1-x)}Ti_xO_3 - 0.05\ Pb(Mn_ySb_{(1-y)})O_3 + v$ (% by weight) $SiO_2$

| Sample No. | Composition | | | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 1* | 0.50 | 0.45 | 0.020 | 1000 | 6.45 | 2.8E + 07 | 520 | 14.3 | 280 |
| 2* | 0.50 | 0.50 | 0.020 | 1000 | 6.75 | 5.8E + 08 | 520 | 15.8 | 340 |
| 3 | 0.50 | 0.51 | 0.005 | 1000 | 7.71 | 4.2E + 11 | 1180 | 47.5 | 1840 |
| 4 | 0.50 | 0.51 | 0.010 | 1000 | 7.72 | 6.7E + 11 | 1170 | 48.2 | 1780 |
| 5 | 0.50 | 0.51 | 0.050 | 1000 | 7.68 | 8.2E + 11 | 1120 | 48.0 | 1750 |
| 6 | 0.50 | 0.51 | 0.080 | 1000 | 7.68 | 9.2E + 11 | 1150 | 48.2 | 1640 |
| 7 | 0.50 | 0.51 | 0.100 | 1000 | 7.66 | 9.4E + 11 | 1160 | 47.9 | 1820 |
| 8 | 0.50 | 0.55 | 0.020 | 1000 | 7.72 | 4.6E + 12 | 1130 | 46.7 | 1950 |
| 9 | 0.50 | 0.60 | 0.020 | 1000 | 7.76 | 1.2E + 12 | 1130 | 46.8 | 2020 |
| 10 | 0.50 | 0.75 | 0.020 | 1000 | 7.81 | 1.7E + 12 | 1150 | 46.8 | 2020 |
| 11 | 0.50 | 0.85 | 0.020 | 1000 | 7.79 | 9.8F + 11 | 1120 | 46.5 | 2220 |
| 12 | 0.46 | 0.90 | 0.020 | 1000 | 7.79 | 8.9E + 11 | 740 | 46.7 | 2050 |
| 13 | 0.47 | 0.90 | 0.020 | 1000 | 7.73 | 7.8E + 11 | 820 | 49.8 | 1760 |

TABLE 2

$0.95\ PbZr_{(1-x)}Ti_xO_3 - 0.05\ Pb(Mn_ySb_{(1-y)})O_3 + v$ (% by weight) $SiO_2$

| Sample No. | Composition | | | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 14 | 0.48 | 0.90 | 0.020 | 1000 | 7.75 | 1.9E + 12 | 1300 | 52.4 | 1980 |
| 15 | 0.49 | 0.90 | 0.020 | 1000 | 7.69 | 2.0E + 12 | 1190 | 46.2 | 1800 |
| 16 | 0.50 | 0.90 | 0.020 | 1000 | 7.77 | 3.8E + 12 | 1100 | 44.5 | 2360 |
| 17 | 0.51 | 0.90 | 0.020 | 1000 | 7.82 | 4.8E + 12 | 1070 | 38.2 | 2420 |
| 18 | 0.50 | 0.95 | 0.020 | 1000 | 7.75 | 5.9E + 12 | 1050 | 37.9 | 2480 |
| 19 | 0.50 | 0.98 | 0.020 | 1000 | 7.79 | 5.9E + 11 | 1030 | 37.7 | 2540 |
| 20 | 0.50 | 0.99 | 0.005 | 1000 | 7.72 | 3.8E + 11 | 980 | 35.4 | 1980 |
| 21 | 0.50 | 0.99 | 0.020 | 1000 | 7.71 | 4.5E + 12 | 1000 | 36.8 | 2040 |
| 22 | 0.50 | 0.99 | 0.040 | 1000 | 7.70 | 6.2E + 12 | 1010 | 37.8 | 2020 |
| 23 | 0.50 | 0.99 | 0.080 | 1000 | 7.71 | 7.2E + 12 | 1040 | 37.2 | 1980 |
| 24 | 0.50 | 0.99 | 0.100 | 1000 | 7.69 | 2.9E + 12 | 1060 | 36.9 | 2100 |
| 25* | 0.50 | 1.00 | 0.020 | 1000 | 7.48 | 9.8E + 10 | 920 | 18.5 | 350 |
| 26* | 0.50 | 1.10 | 0.020 | 1000 | 6.78 | 7.6E + 08 | 680 | 9.6 | 540 |
| 27*+ | 0.50 | 1.20 | 0.020 | 1000 | 5.75 | 8.2E + 07 | 640 | — | — |

A sample with a sample No. denoted by a mark (*) shows that the sample has a composition out of the range of the present invention.

A sample with a sample No. denoted by a mark (+) shows that its sintering property is not so sufficient that polarization treatment has been impossible.

Tables 1 and 2 clearly shows that good piezoelectric characteristics could be obtained even by firing at a temperature of as low as 1000° C. in the piezoelectric ceramic compositions (sample Nos. 3 to 24) with a molar ratio z of Mn/Sb of larger than 0.50 and smaller than 1.00.

The sintering density was low and the piezoelectric characteristics are deteriorated when the molar ratio z of Mn/Sb is 0.50 or less, or 1.00 or more (the sample Nos. 1 and 2, and 25 to 27).

EXAMPLE 2

PbO, $TiO_2$, $ZrO_2$, $MnO_2$, $Sb_2O_5$ and $SiO_2$ were blended to be a composition of $Pb(Zr_{1-x}Ti_x)O_3$+2.0 mol % of {$bMnO_2$+

Disk-shaped piezoelectric ceramics were manufactured using these starting material powders by the same method as in Example 1.

Figure 2:
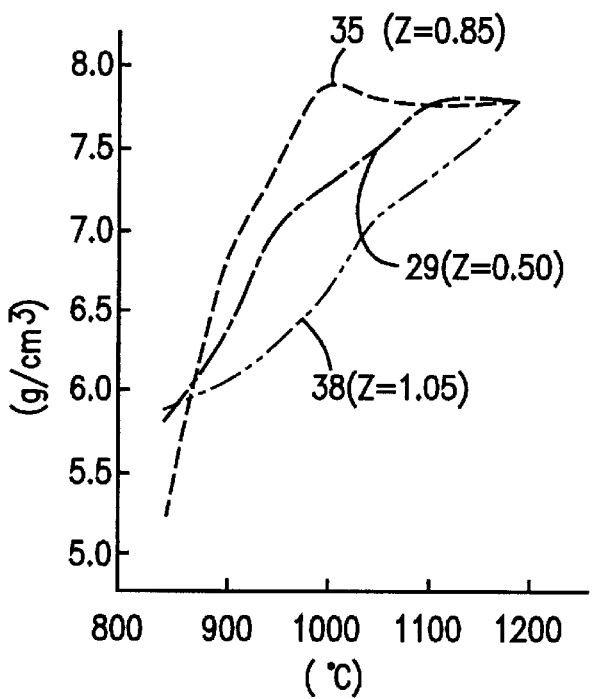
FIG. 2 shows the relation between the firing temperature of the piezoelectric ceramic composition and the sintering density of the piezoelectric member obtained when the molar ratio z of Mn/Sb in Example 2 is changed.

FIG. 2 shows the relations between the firing temperature and the sintering density of the piezoelectric ceramics obtained from respective samples of the sample Nos. 29, 35 and 38 with x=0.5 and v=0.05 as representative examples.

A sufficient sintering density cannot be obtained in the piezoelectric ceramic compositions of the sample No. 29 with the molar ratio z of 0.50, unless the firing temperature is 1100° C. or more. A sufficient sintering density cannot be also obtained unless the firing temperature is 1200° C. or more in the composition of the sample No. 38 with the molar ratio z of 1.00 or more. On the contrary, a sufficient sintering density is obtained even by firing at a temperature of as low as about 950° C. in sample No. 35 with a molar ratio z of 0.85.

Accordingly, the sintering property of the piezoelectric ceramics can be largely improved by adjusting the molar ratio z to be larger than 0.50 and smaller than 1.00, when Mn and Sb are added as sub-components.

Each piezoelectric ceramic obtained in Example 2 was subjected to a polarization treatment to assess its piezoelectric characteristics after forming the electrodes as in Example 1. The results are shown in Table 3.

shown in Tables 4 and 5 below were prepared by variously changing the values of x, y and v. The values of z in Tables 4 and 5 denotes the molar ratio of Cr and Sb represented by Z=y/(1−y). Disk-shaped piezoelectric ceramics were obtained by the same method as in Example 1, and their piezoelectric characteristics were assessed.

TABLE 3

$PbZr_{(1-x)}Ti_xO_3 + 2\ mol\ \%\ (\beta/2\ MnO_2 + \{(1-\beta/2\}Sb_2O_3) + v\ (\%\ by\ weight)\ SiO_2$

| Sample No. | Composition x | z | v (% by weight) | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| 28* | 0.50 | 0.45 | 0.050 | 1000 | 6.65 | 6.6E + 07 | 580 | — | — |
| 29* | 0.50 | 0.50 | 0.050 | 1000 | 7.23 | 3.6E + 08 | 920 | 8.2 | 380 |
| 30 | 0.50 | 0.51 | 0.005 | 1000 | 7.72 | 8.2E + 11 | 1160 | 45.8 | 2020 |
| 31 | 0.50 | 0.51 | 0.050 | 1000 | 7.82 | 8.4E + 11 | 1180 | 46.2 | 2060 |
| 32 | 0.50 | 0.51 | 0.100 | 1000 | 7.81 | 7.9E + 11 | 1190 | 46.8 | 1890 |
| 33 | 0.50 | 0.55 | 0.050 | 1000 | 7.76 | 9.9E + 11 | 1180 | 45.2 | 2000 |
| 34 | 0.50 | 0.75 | 0.050 | 1000 | 7.75 | 2.9E + 12 | 1180 | 44.7 | 2010 |
| 35 | 0.50 | 0.85 | 0.050 | 1000 | 7.82 | 3.5E + 11 | 1120 | 44.0 | 1870 |
| 36 | 0.50 | 0.99 | 0.050 | 1000 | 7.84 | 7.2E + 11 | 1080 | 42.8 | 2350 |
| 37* | 0.50 | 1.00 | 0.050 | 1000 | 7.01 | 5.6E + 09 | 980 | 20.2 | 680 |
| 38*+ | 0.50 | 1.05 | 0.050 | 1000 | 6.54 | 2.3E + 08 | 660 | — | — |

A sample denoted by the mark (*) at its sample No. shows that the composition is out of the range of the present invention.

A sample denoted by the mark (+) at its sample No. show that the sintering property is not so sufficient that polarization treatment has been impossible.

Table 3 clearly shows that good piezoelectric characteristics can be obtained in the composition having the molar ratio z of larger than 0.50 and smaller than 1.00 (sample Nos. 30 to 36).

On the contrary, sufficient piezoelectric characteristics cannot be obtained when the starting materials having compositions with the molar ratio z of 0.50 or less (sample Nos. 28 and 29) or the starting materials having compositions with the molar ratio z of 1.00 or more (sample Nos. 37 and 38) are used.

Accordingly, good piezoelectric characteristics can be obtained even by firing at a temperature of as low as about 1000° C. when the piezoelectric ceramic has a composition with the molar ratio z of larger than 0.50 and smaller than 1.00.

EXAMPLE 3

PbO, TiO₂, ZrO₂, Cr₂O₃, Sb₂O₅ and SiO₂ were blended as a starting material to be a composition of $0.95Pb(Zr_{1-x}Ti_x)O_3-0.05Pb(Cr_ySb_{1-y})O_3+v\ \%$ by weight of SiO₂. Respective starting material powders with the sample Nos. 39 to 64

Figure 3:
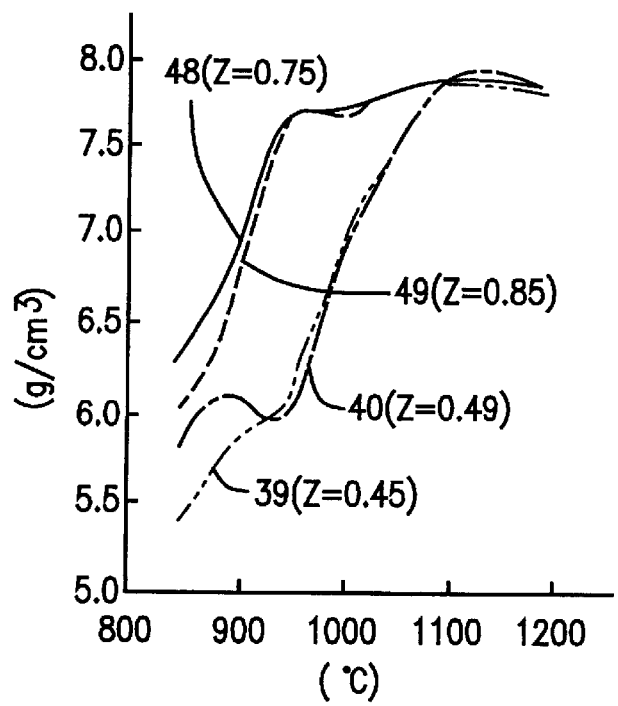
FIG. 3 shows the relation between the firing temperature of the piezoelectric ceramic composition and the sintering density of the piezoelectric member obtained when the molar ratio z of Mn/Sb in Example 3 is changed.
Figure 4:
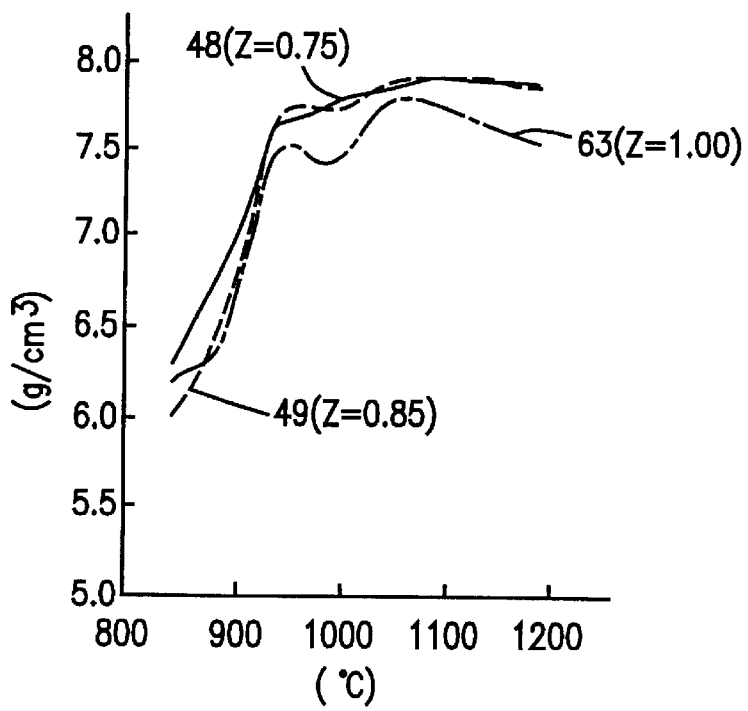
FIG. 4 shows the relation between the firing temperature of the piezoelectric ceramic composition and the sintering density of the piezoelectric member obtained when the molar ratio z of Cr/Sb in Example 3 is changed.

FIGS. 3 and 4 show the relation between the firing temperature and the sintering density of the piezoelectric ceramic obtained in the samples with the sample Nos. 39, 40, 48, 49 and 63 having the composition (% by weight) represented by z=0.50 and v=0.02.

FIG. 3 shows that a sufficient sintering density cannot be obtained unless the ceramics are fired at a temperature exceeding at least 1100° C. in the samples with the sample Nos. 39 and 40 having the compositions with the molar ratio z of Cr/Sb of 0.50 or less. FIG. 4 also show that a sufficient sintering density is not obtained in the sample with the sample No. 63 having a composition with the molar ratio z of Cr/Sb of 1.00 or more.

On the contrary, in sample Nos. 48 or 49 having a composition with the molar ratio z of 0.75 or 0.85, respectively, a sufficient sintering density is obtained even by firing at a temperature of as low as about 940° C. This is because the boundary between the composition range where sintering property is improved and the composition range where sintering property is scarcely improved is so clear that a small change in the composition causes a large change of the sintering property at the composition close to the boundary composition.

Accordingly, it may be understood that the sintering property can be largely improved by adjusting the molar ratio z of Cr/Sb to be larger than 0.50 and smaller than 1.00.

TABLE 4

$0.95\ PbZr_{(1-x)}Ti_xO_3 - 0.05\ Pb(Cr_ySb_{(1-y)})O_3 + v\ (\%\ by\ weight)\ SiO_2$

| Sample No. | Composition x | z | v (% by weight) | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| 39*+ | 0.50 | 0.45 | 0.020 | 1000 | 6.74 | 6.6E + 07 | 780 | — | — |
| 40* | 0.50 | 0.49 | 0.020 | 1000 | 6.76 | 8.2E + 07 | 950 | 19.5 | 74 |
| 41 | 0.50 | 0.51 | 0.005 | 1000 | 7.49 | 8.5E + 11 | 1050 | 35.8 | 140 |
| 42 | 0.50 | 0.51 | 0.010 | 1000 | 7.50 | 9.0E + 11 | 1070 | 36.1 | 140 |

TABLE 4-continued $0.95\ PbZr_{(1-x)}Ti_xO_3 - 0.05\ Pb(Cr_ySb_{(1-y)})O_3 + v$ (% by weight) $SiO_2$

| Sample No. | Composition | | | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 43 | 0.50 | 0.51 | 0.020 | 1000 | 7.52 | 8.6E + 11 | 1080 | 36.3 | 120 |
| 44 | 0.50 | 0.51 | 0.050 | 1000 | 7.61 | 9.2E + 11 | 1080 | 36.2 | 130 |
| 45 | 0.50 | 0.51 | 0.100 | 1000 | 7.63 | 1.2E + 12 | 1100 | 37.1 | 140 |
| 46 | 0.50 | 0.55 | 0.020 | 1000 | 7.56 | 8.6E + 11 | 1120 | 38.4 | 140 |
| 47 | 0.50 | 0.60 | 0.020 | 1000 | 7.55 | 8.8E + 11 | 1110 | 53.9 | 138 |
| 48 | 0.50 | 0.75 | 0.020 | 1000 | 7.62 | 9.1E + 11 | 1180 | 48.9 | 174 |
| 49 | 0.50 | 0.85 | 0.020 | 1000 | 7.64 | 9.2E + 11 | 1220 | 47.2 | 170 |
| 50 | 0.46 | 0.90 | 0.020 | 1000 | 7.64 | 9.0E + 11 | 730 | 55.3 | 254 |
| 51 | 0.47 | 0.90 | 0.020 | 1000 | 7.64 | 8.9E + 11 | 1150 | 59.8 | 243 |

TABLE 5

$0.95\ PbZr_{(1-x)}Ti_xO_3 - 0.05\ Pb(Cr_ySb_{(1-y)})O_3 + v$ (% by weight) $SiO_2$

| Sample No. | Composition | | | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 52 | 0.48 | 0.90 | 0.020 | 1000 | 7.63 | 9.1E + 11 | 1430 | 56.4 | 272 |
| 53 | 0.49 | 0.90 | 0.020 | 1000 | 7.62 | 9.2E + 11 | 1340 | 53.1 | 300 |
| 54 | 0.50 | 0.90 | 0.020 | 1000 | 7.63 | 9.2E + 11 | 1130 | 45.3 | 412 |
| 55 | 0.51 | 0.90 | 0.020 | 1000 | 7.60 | 9.2E + 11 | 990 | 40.3 | 465 |
| 56 | 0.50 | 0.95 | 0.020 | 1000 | 7.54 | 6.5E + 11 | 1050 | 46.2 | 280 |
| 57 | 0.50 | 0.98 | 0.020 | 1000 | 7.52 | 5.8E + 11 | 1010 | 46.8 | 250 |
| 58 | 0.50 | 0.99 | 0.005 | 1000 | 7.52 | 6.0E + 11 | 970 | 47.9 | 200 |
| 59 | 0.50 | 0.99 | 0.020 | 1000 | 7.51 | 4.8E + 11 | 980 | 48.2 | 190 |
| 60 | 0.50 | 0.99 | 0.040 | 1000 | 7.51 | 5.2E + 11 | 980 | 48.3 | 200 |
| 61 | 0.50 | 0.99 | 0.080 | 1000 | 7.50 | 6.3E + 11 | 990 | 47.9 | 190 |
| 62 | 0.50 | 0.99 | 0.100 | 1000 | 7.49 | 4.9E + 11 | 980 | 46.3 | 180 |
| 63* | 0.50 | 1.00 | 0.020 | 1000 | 7.42 | 3.2E + 09 | 980 | 28.9 | 75 |
| 64* | 0.50 | 1.10 | 0.020 | 1000 | 6.95 | 5.4E + 08 | 820 | 20.5 | 64 |

A sample denoted by the mark (*) show that its composition is out of the range of the present invention.

A sample denoted by the mark (+) show that its sintering property is so insufficient that polarization treatment has been impossible.

Figure 5:
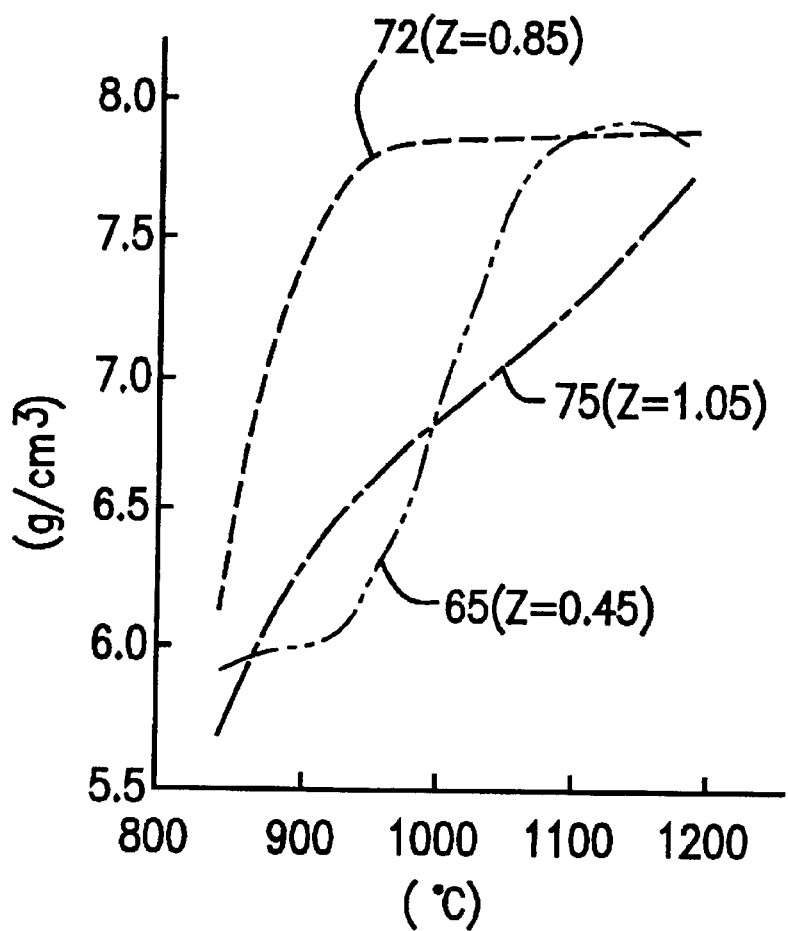
FIG. 5 shows the relation between the firing temperature of the piezoelectric ceramic composition and the sintering density of the piezoelectric member obtained when the molar ratio z of Cr/Sb in Example 4 is changed.

FIGS. 4 and 5 show that good piezoelectric characteristics are obtainable even by firing at a temperature of as low as 1000° C. in the piezoelectric ceramic compositions (the sample Nos. 41 to 62) having the molar ratio z of Cr/Sb of larger than 0.50 and smaller than 1.00.

In the samples having the compositions with the molar ratio z of Cr/Sb of 0.50 or less or 1.00 or more (Sample Nos. 39, 40, 63 and 64), the sintering density was low and the piezoelectric characteristics were deteriorated.

EXAMPLE 4

PbO, TiO$_2$, ZrO$_2$, Cr$_2$O$_3$, Sb$_2$O$_5$ and SiO$_2$ were blended to be a composition of Pb(Zr$_{1-x}$Ti$_x$)O$_3$+2.0 mol % of {β/2Cr$_2$O$_3$+(1−βP)/2Sb$_2$O$_5$}+v % by weight of SiO$_2$. Respective starting material powders of the sample Nos. 65 to 75 shown in Table 6 were prepared by variously changing the values of x, and v. The molar ratio z of Cr and Sb is represented by z=β/(1−β). Disk-shaped piezoelectric ceramics were manufactured by the same method as in Example 1. The relations between the firing temperature and the sintering density are shown in FIG. 5, wherein the piezoelectric ceramics as representative examples were obtained from respective starting materials of the sample Nos. 65, 72 and 75 having the compositions (in % by weight) represented by x=0.5 and v=0.02.

A sufficient sintering density cannot be obtained unless the firing temperature is 1100° C. or more in the compositions of the sample No. 65 having a molar ratio z of 0.50 or less. A sufficient sintering density cannot be also obtained in the composition of the sample No. 75 having a molar ratio z of 1.00 or more. On the contrary, a sufficient sintering density is obtainable by firing at a temperature of as low as about 950° C. in the composition of the sample No. 72 having a molar ratio z of 0.85. Accordingly, it can be understood that the sintering property of the piezoelectric ceramic may be largely improved by adjusting the molar ratio z to be larger than 0.5 and smaller than 1.00, when Cr and Sb are added as sub-components into the piezoelectric ceramic compositions comprising Pb(Zr$_{1-x}$Ti$_x$)O$_3$ as a principal component.

Piezoelectric characteristics were also assessed in Example 4 by applying a polarization treatment after forming electrodes on respective piezoelectric ceramics by the same method as in Example 1. The results are shown in Table 6 below.

TABLE 6

| | Composition | | | Firing | Sintering | | Relative | | Mechanical |
|---|---|---|---|---|---|---|---|---|---|
| Sample No. | x | z | v (% by weight) | temperature (° C.) | density (g/cm³) | Resistivity Ω · cm | Dielectric Constant | Electromechanical Coupling Coefficient | Quality Coefficient |
| 65*+ | 0.50 | 0.45 | 0.050 | 1000 | 6.68 | 6.5E + 07 | 810 | — | — |
| 66* | 0.50 | 0.50 | 0.050 | 1000 | 7.01 | 1.2E + 08 | 920 | 18.4 | 65 |
| 67 | 0.50 | 0.51 | 0.005 | 1000 | 7.58 | 9.9E + 10 | 1180 | 50.8 | 110 |
| 68 | 0.50 | 0.51 | 0.050 | 1000 | 7.62 | 5.4E + 11 | 1270 | 54.4 | 120 |
| 69 | 0.50 | 0.51 | 0.050 | 1000 | 7.61 | 6.3E + 11 | 1220 | 54.3 | 120 |
| 70 | 0.50 | 0.55 | 0.100 | 1000 | 7.64 | 9.2E + 11 | 1210 | 52.2 | 180 |
| 71 | 0.50 | 0.75 | 0.050 | 1000 | 7.62 | 8.4E + 11 | 1240 | 51.1 | 194 |
| 72 | 0.50 | 0.85 | 0.050 | 1000 | 7.65 | 3.2E + 11 | 1200 | 50.4 | 220 |
| 73 | 0.50 | 0.95 | 0.050 | 1000 | 7.64 | 9.2E + 11 | 1190 | 49.8 | 240 |
| 74* | 0.50 | 1.00 | 0.050 | 1000 | 7.38 | 2.4E + 09 | 950 | 24.2 | 58 |
| 75*+ | 0.50 | 1.05 | 0.050 | 1000 | 6.60 | 2.1E + 07 | 740 | — | — |

Table header formula: $PbZr_{(1-x)}Ti_xO_3 + 2$ mol % $(\beta/2Cr_2O_2 + \{(1-\beta)/2\}Sb_2O_5) + v$ (% by weight) $SiO_2$ A sample denoted by the mark (*) shows that its composition is out of the range of the present invention.

A sample denoted by the mark (+) shows that its sintering property is not so sufficient that polarization treatment has been impossible.

Table 6 shows that good piezoelectric characteristics can be obtained in the samples having the compositions with the molar ratio z of larger than 0.50 and smaller than 1.00 (the sample Nos. 67 to 73).

Sufficient piezoelectric characteristics are obtainable, on the contrary, when the compositions of the sample Nos. 65 and 66 having the molar ratio z of 0.50 or less, or the compositions of the sample Nos. 74 and 75 having the molar ratio z of 1.00 or more were used.

Accordingly, sufficient piezoelectric characteristics are obtainable even by firing at a temperature of as low as about 1000° C., when the molar ratio z is larger than 0.50 or smaller than 1.00.

Piezoelectric Element as an Application Object of the Present Invention

Figure 6:
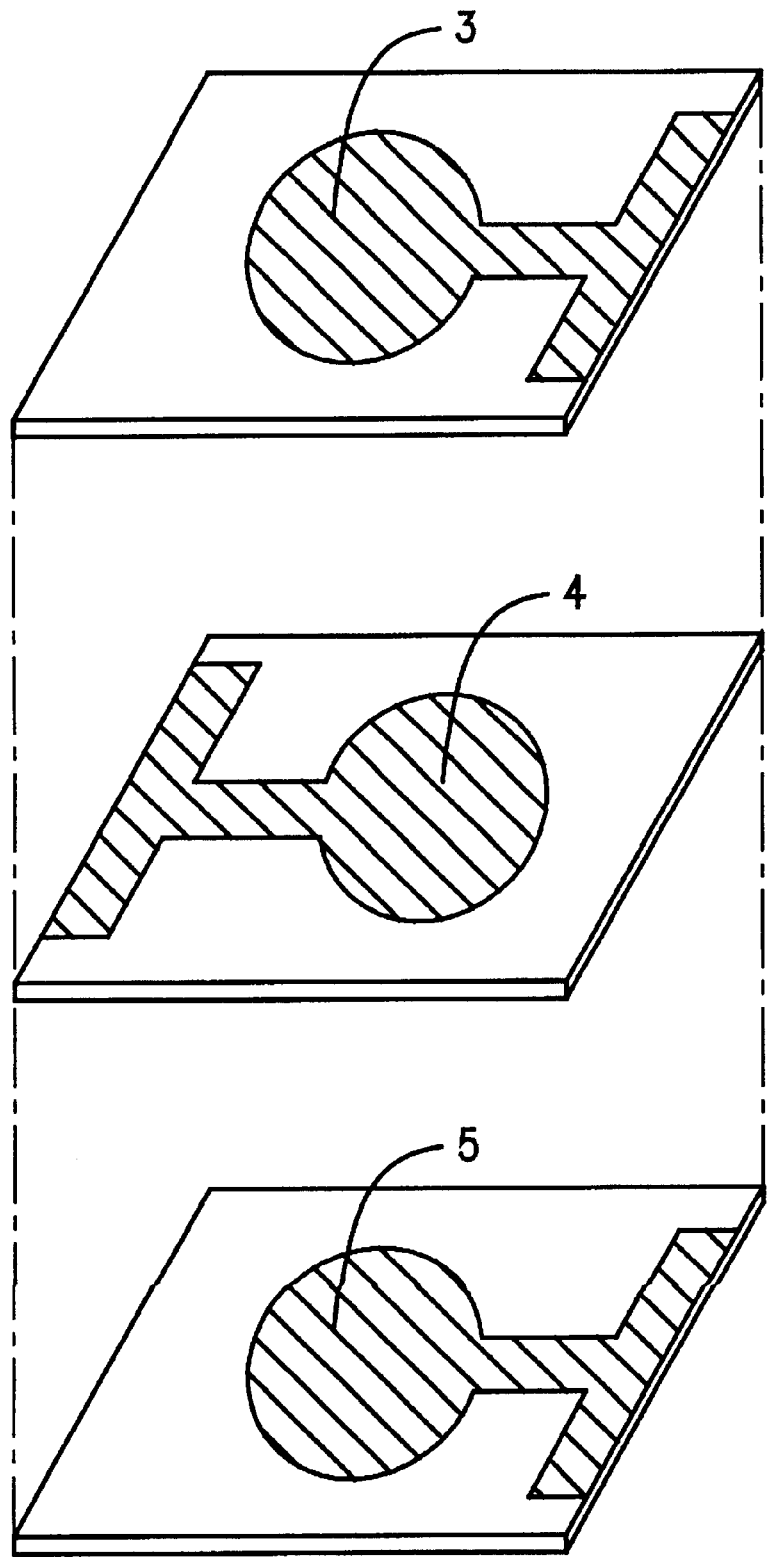
FIG. 6 is a disassembled perspective view of the piezoelectric resonator according to one embodiment of the present invention.
Figure 7:
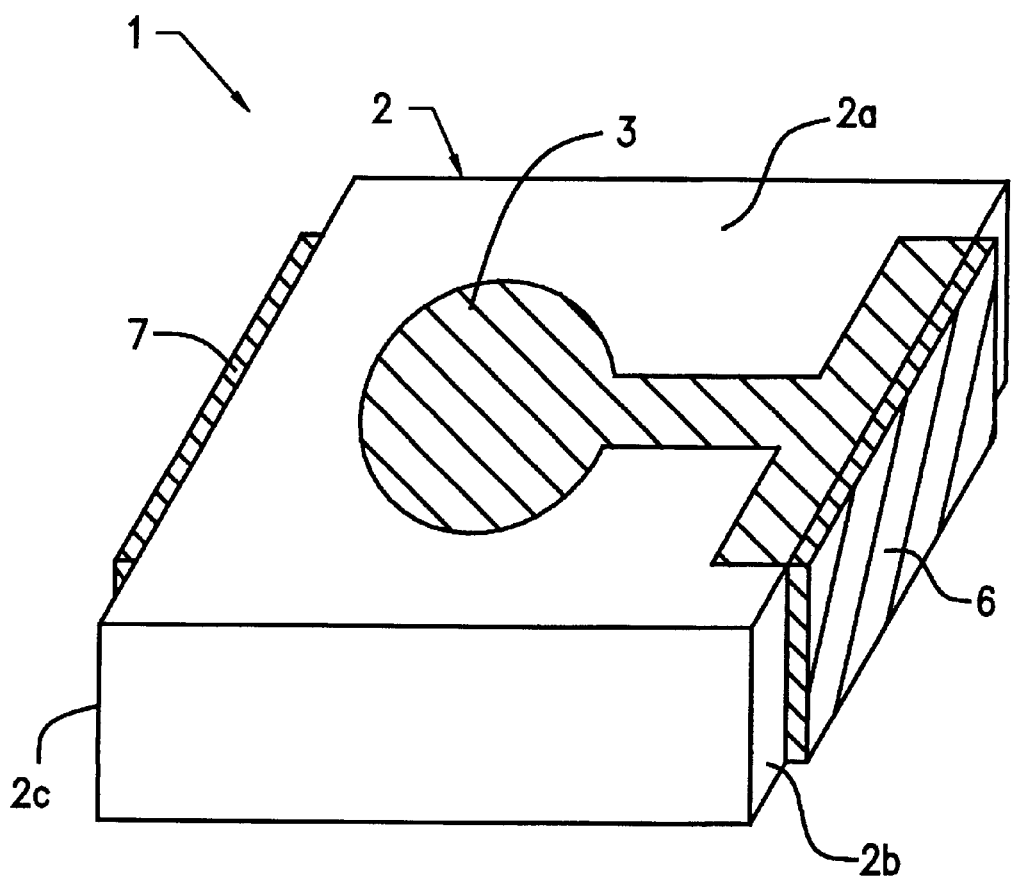
FIG. 7 is a perspective view showing the appearance of the piezoelectric resonator according to one embodiment of the present invention.

The piezoelectric ceramic compositions according to the present invention can be used for various piezoelectric elements such as piezoelectric resonators, piezoelectric transformers and piezoelectric actuators. FIGS. 6 and 7 are a disassembled perspective view and an overall perspective view, respectively, showing one example of the piezoelectric resonator constructed by using the piezoelectric ceramic composition according to the present invention. A piezoelectric member 2 comprising the piezoelectric ceramic composition according to the present invention is used in this piezoelectric resonator 1. The piezoelectric member 2 has a rectangular plate shape. A resonant electrode 3 is formed on the upper face 2a of the piezoelectric member 2. Resonant electrodes 4 and 5 are also formed within the piezoelectric member 2 as inner electrodes as shown by the disassembled perspective view in FIG. 6, so that the inner electrodes overlap the resonant electrode 3 viewed along the direction of thickness. The resonant electrodes 3 to 5 overlap one another along the direction of thickness via the piezoelectric layer to form a energy confinement type piezoelectric vibrator.

The resonant electrodes 3 to 5 extend out of one end face 2b of the piezoelectric member 2, and are electrically connected to an outer electrode 6. The resonant electrode 4 extends out of the other end face 2c, and is electrically connected to an outer electrode 7.

The piezoelectric member 2 is polarized toward the direction of thickness. Consequently, the piezoelectric resonator 1 functions as an energy confinement type piezoelectric resonator taking advantage of a second harmonic wave of the longitudinal vibration along the direction of thickness by applying an alternating voltage between the outer electrodes 6 and 7.

Figure 8:
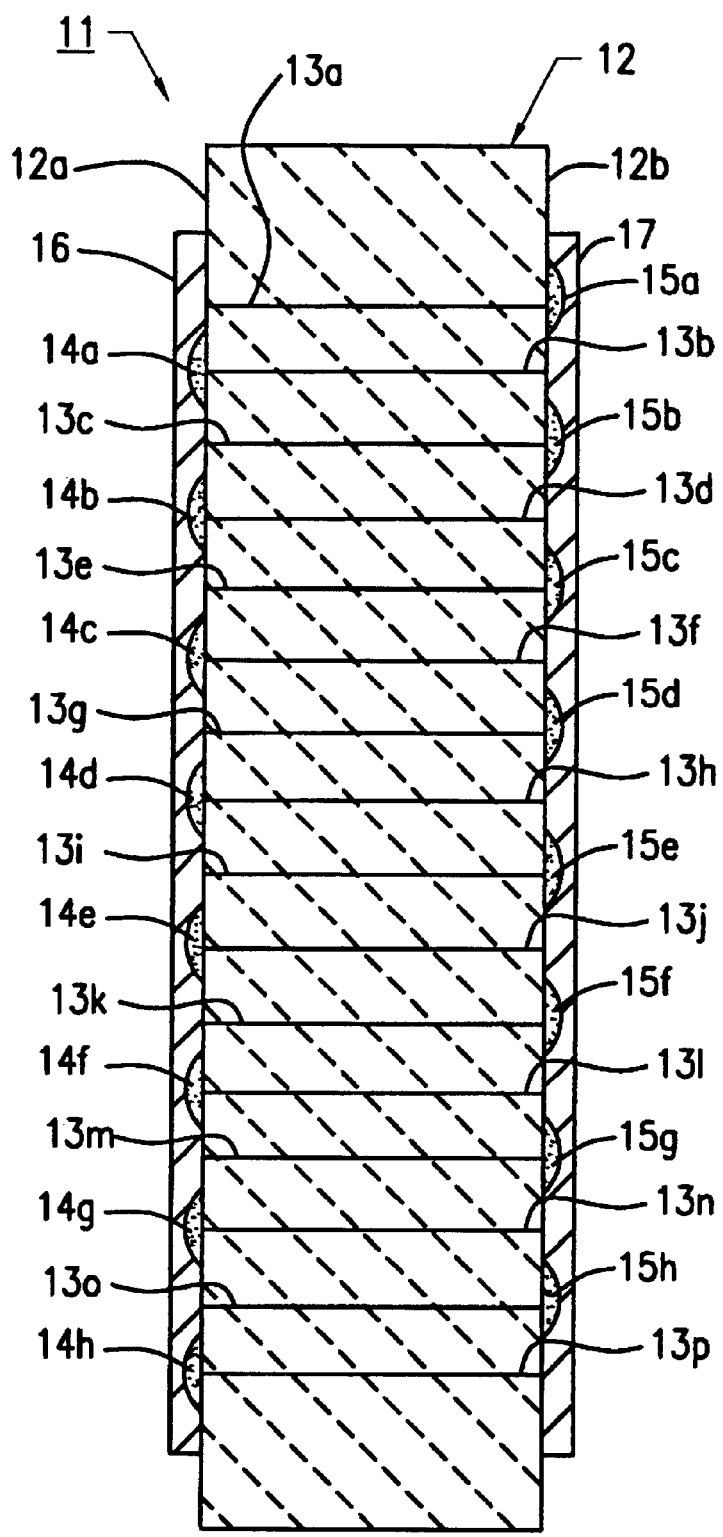
FIG. 8 is a cross section showing the piezoelectric resonator according to an another embodiment of the present invention.
Figure 9:
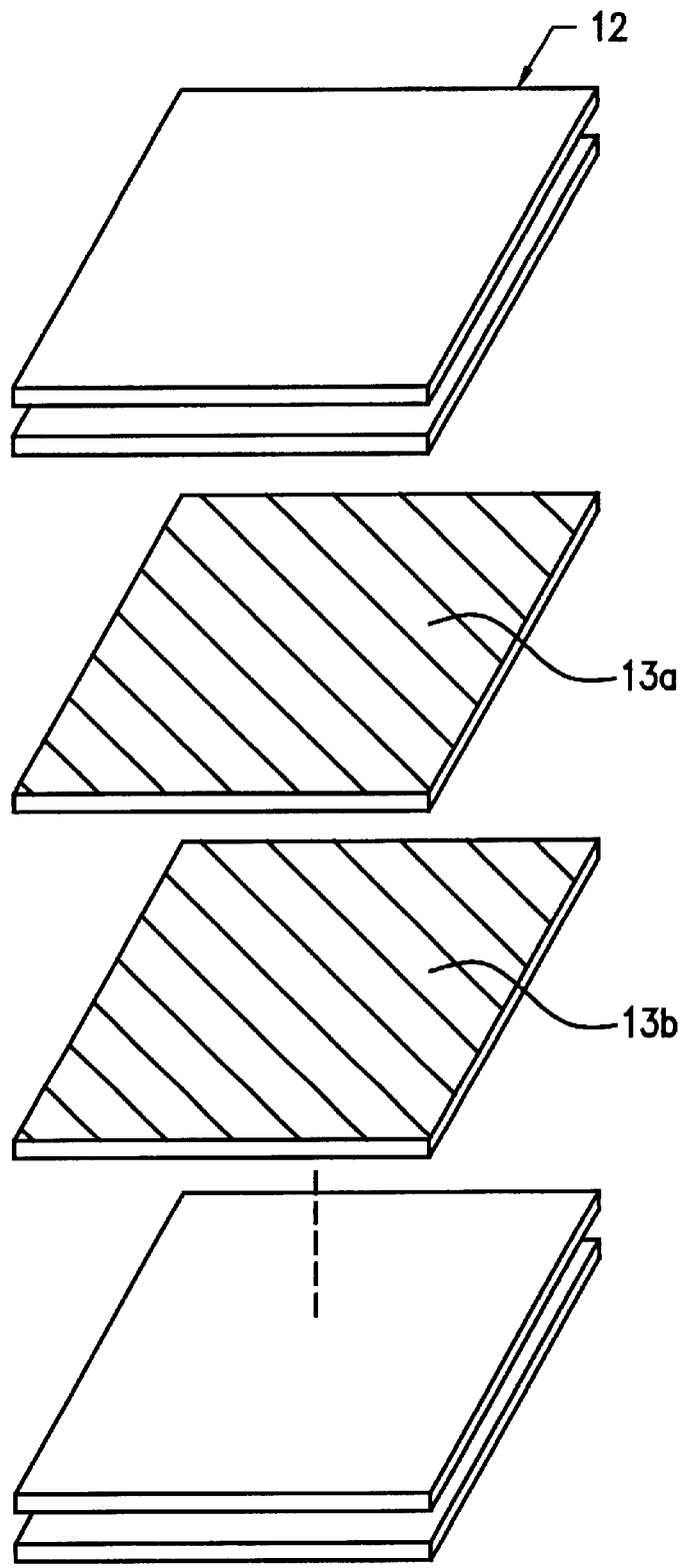
FIG. 9 is a disassembled perspective view for describing the shape of the inner electrode of the piezoelectric resonator shown in FIG. 8.

FIGS. 8 and 9 show a cross section and a disassembled perspective view, respectively, for describing an another example of the piezoelectric resonator using the piezoelectric ceramic composition according to the present invention.

A plurality of inner electrodes 13a to 13p are formed within the piezoelectric member of the lamination type piezoelectric resonator 11 as shown in FIG. 8. As is illustrated in FIG. 9, the inner electrodes 13a and 13b are formed over the entire face at a given elevation of the piezoelectric member 12. The other electrodes 13c to 13p are also formed as whole face electrodes.

Insulation layers 14a to 14h are formed on one side face 12a of the piezoelectric member 12, and insulation layers 15a to 15h are formed on the opposed side face 12b of the piezoelectric member 12. The portion of the inner electrode 13a exposed on the side face 12b is covered with the insulation layer 15a. The portion of the subsequent inner electrode 13b exposed on the side face 12a is covered with the insulation layer 14a. Likewise, the inner electrodes 13a to 13p are alternately exposed on the side faces 12b or 12a and are covered with an insulation material.

Outer electrodes 16 and 17 are formed on the side faces 12a and 12b, respectively. The piezoelectric member 12 is uniformly polarized along the direction of thickness.

Consequently, the piezoelectric member serves as a piezoelectric resonator by applying a direct current voltage between the outer electrodes 16 and 17.

Figure 10:
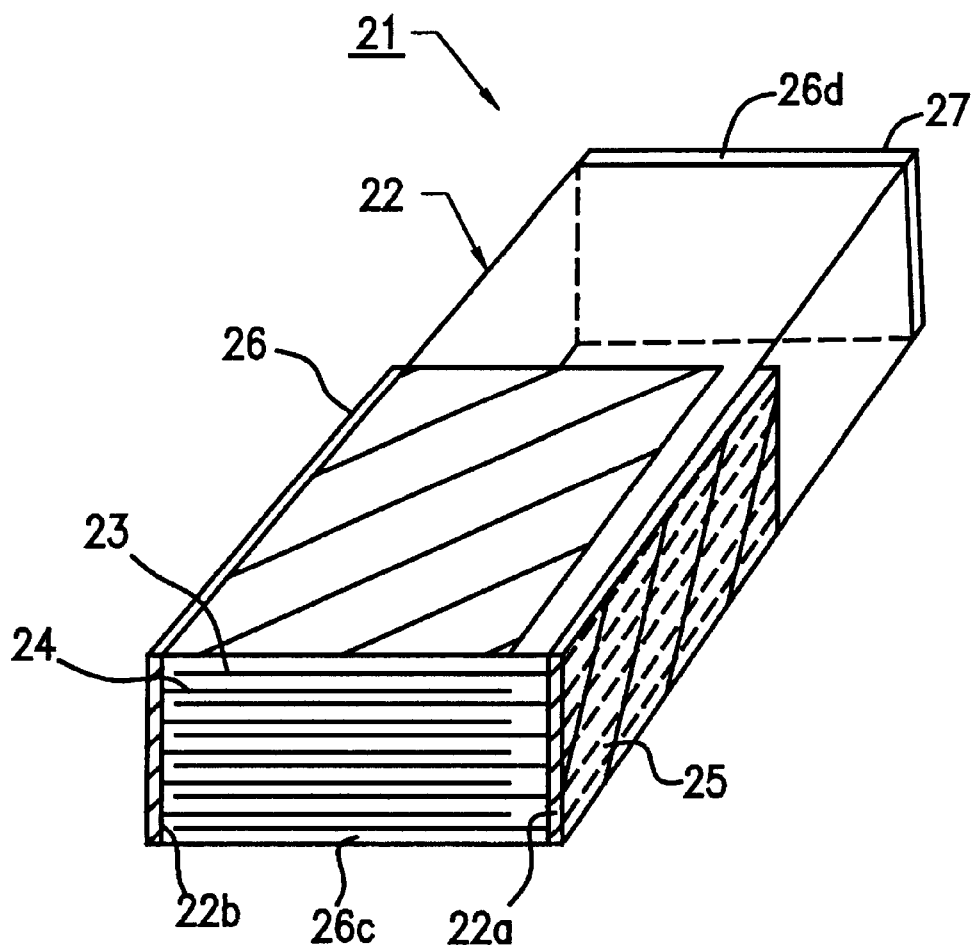
FIG. 10 is a perspective view of the piezoelectric transformer as a further different embodiment of the present invention.

FIG. 10 is a perspective view showing one example of the piezoelectric transformer using the piezoelectric ceramic composition according to the present invention. A plurality of inner electrodes 23 and 24 are alternately laminated along the direction of thickness within the piezoelectric member 22 of the piezoelectric transformer 21. The plural inner electrodes 23 extend out of one side face 22a of the piezoelectric member 22, and the plural inner electrodes 24 extend out of the other side face 22b of the piezoelectric member 22. The inner electrodes 23 and 24 are located at one end face side relative to the center of the piezoelectric member 22 along the longitudinal direction. Outer electrodes 25 and 26 are formed on the side faces 22a and 22b, respectively, and an outer electrode 27 is formed on the end face 26d opposed to the end face 26c. The piezoelectric member 22 is polarized along the longitudinal direction. Consequently, the piezoelectric member can be operated as a Rosen type piezoelectric transformer by allowing the outer electrodes 25 and 26 to serve as input electrodes and the outer electrode 27 to serve as an output electrode.

Figure 11:
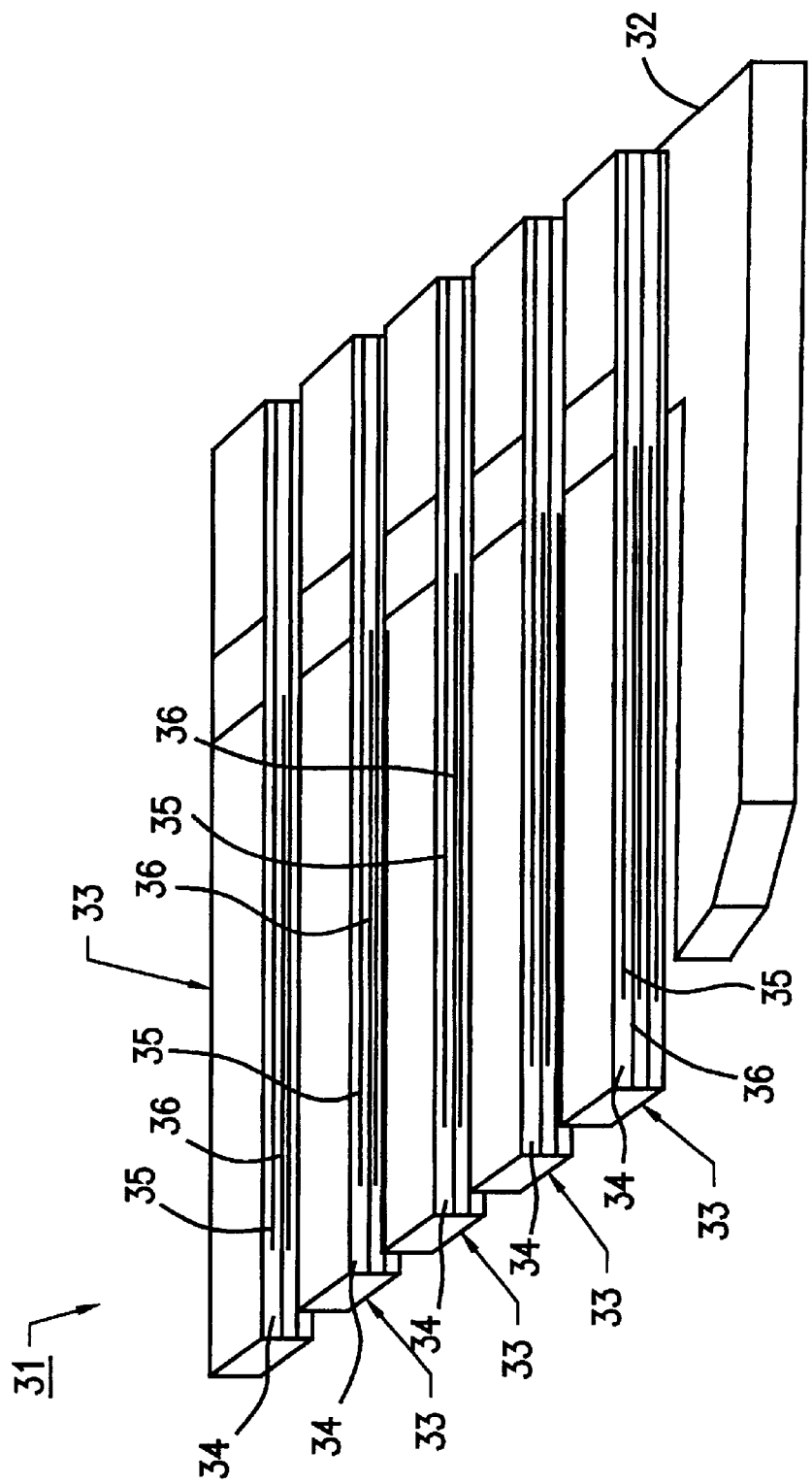
FIG. 11 is a perspective view of the piezoelectric actuator as a further different embodiment of the present invention.

FIG. 11 is a perspective view showing an actuator device constituting a head driving unit of an ink-jet printer as an example of the piezoelectric actuator using the piezoelectric ceramic composition according to the present invention. A plurality of the lamination type piezoelectric actuators 33 are fixed on a substrate 32 in the piezoelectric actuator device 31. The piezoelectric actuator 33 is composed of the piezoelectric member 34, which is composed of the piezoelectric ceramic composition according to the present invention. A plurality of inner electrodes 35 and 36 are disposed so as to overlap one another within the piezoelectric member 34.

Since the plural inner electrodes 35 and 36 are alternately disposed along the direction of thickness, each piezoelectric actuator 33 is allowed to displace by applying an alternate current voltage between the inner electrodes 35 and 36.

The piezoelectric resonators 1 and 11, the piezoelectric transformer 21 and the piezoelectric actuator 33 are merely examples of the constructions of the piezoelectric elements using the piezoelectric ceramic composition according to the present invention, which can be used for other piezoelectric resonators, piezoelectric transformers and piezoelectric actuators including piezoelectric filters having a variety of constructions.

EXAMPLE 5

Powders of PbO, $TiO_2$, $ZrO_2$, $MnO_2$ and $Ta_2O_5$ as starting materials were blended to be a composition of $0.95Pb(Zr_{1-x}Ti_x)O_3 - 0.05Pb(Mn_yTa_{1-y})O_3$. Each starting material powder of the sample Nos. 76 to 94 shown in Table 7 below was prepared by variously changing the values of x and y. The molar ratio z of Mn and Ta, or the relation of $z = a/(b+c+d+2e)$ in the present invention, is represented by $y/(1-y)$.

A disk-shaped piezoelectric resonator was obtained by the method as in Example 1 using each starting material powder prepared as described above.

Piezoelectric characteristics of radial divergent vibration of the piezoelectric resonator obtained was assessed with an impedance analyzer.

Figure 12:
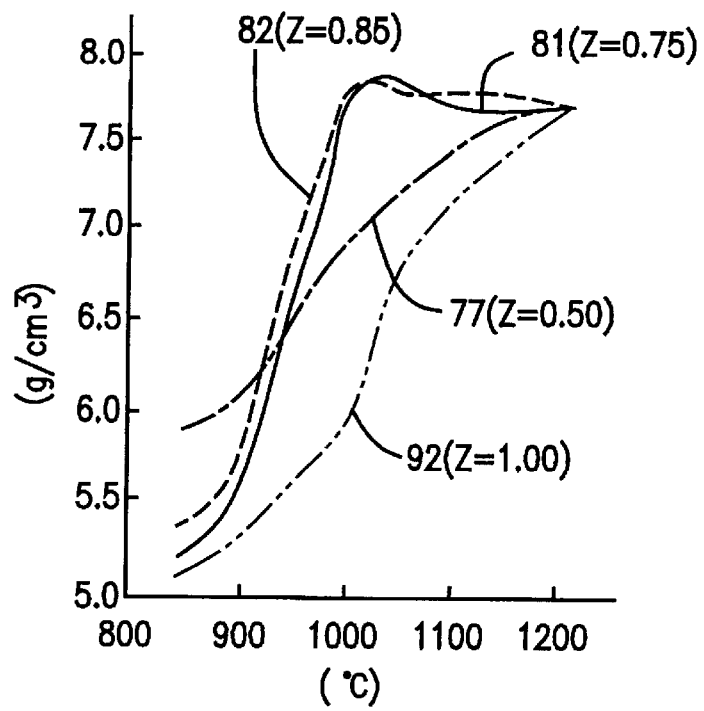
FIG. 12 shows the relation between the firing temperature of the piezoelectric ceramic composition and the sintering density of the piezoelectric member obtained when the molar ratio z of Mn/Ta in Example 5 is changed.

The relations between the firing temperature and sintering density in the piezoelectric ceramics obtained from respective starting materials of the sample Nos. 77, 81, 82 and 92 with x=0.50 are shown in FIG. 12 as representative examples of the piezoelectric resonators using respective starting materials of the sample Nos. 76 to 94.

A sufficient sintering density cannot be obtained unless the ceramic is fired at a temperature exceeding 1200° C. when the starting material of the sample No. 77 with a molar ratio z of 0.05 is used. A sufficient sintering density cannot be also obtained unless the ceramic is fired at a temperature exceeding 1200° C. as well when the starting material of the sample No. 92 with a molar ratio z of 1.00 or more is used.

On the contrary, the sintering density is high enough even by firing at a temperature of as low as about 1000° C. when the starting materials of the sample Nos. 81 and 82 corresponding to the examples of the present invention is used.

The results as described above are obtained because the boundary between the composition range where sintering property is improved and the composition range where the sintering property is scarcely improved is so quite clear that a small change of the composition close to the boundary composition causes the sintering property to be largely different.

Accordingly, the sintering property can be largely improved by adjusting the molar ratio z of Mn/Ta to be larger than 0.50 and smaller than 1.00.

TABLE 7

| Sample No. | Composition x | z | Firing temperature (° C.) | Sintering density (g/cm$^3$) | Resistivity Ω · cm | Relative Dielectric Constant | Electromechanical Coupling Coefficient | Mechanical Quality Coefficient |
|---|---|---|---|---|---|---|---|---|
| 76*+ | 0.50 | 0.45 | 1000 | 6.72 | 5.2E + 06 | 580 | — | — |
| 77* | 0.50 | 0.50 | 1000 | 6.91 | 8.2E + 08 | 980 | 15.4 | 280 |
| 78 | 0.50 | 0.51 | 1000 | 7.62 | 8.2E + 12 | 1020 | 35.4 | 1850 |
| 79 | 0.50 | 0.55 | 1000 | 7.69 | 8.4E + 12 | 1040 | 38.2 | 2120 |
| 80 | 0.50 | 0.60 | 1000 | 7.83 | 8.2E + 12 | 1120 | 41.2 | 2050 |
| 81 | 0.50 | 0.75 | 1000 | 7.72 | 6.5E + 12 | 1150 | 45.6 | 2150 |
| 82 | 0.50 | 0.85 | 1000 | 7.79 | 7.2E + 12 | 1050 | 46.7 | 2060 |
| 83 | 0.46 | 0.90 | 1000 | 7.76 | 7.5E + 12 | 640 | 48.2 | 1980 |
| 84 | 0.47 | 0.90 | 1000 | 7.76 | 6.3E + 12 | 1150 | 55.4 | 1820 |
| 85 | 0.48 | 0.90 | 1000 | 7.75 | 6.5E + 12 | 1180 | 54.2 | 190 |
| 86 | 0.49 | 0.90 | 1000 | 7.71 | 1.2E + 12 | 1070 | 50.4 | 1850 |
| 87 | 0.50 | 0.90 | 1000 | 7.63 | 1.5E + 12 | 1050 | 45.2 | 1890 |
| 88 | 0.51 | 0.90 | 1000 | 7.74 | 2.5E + 12 | 950 | 40.2 | 2100 |
| 89 | 0.50 | 0.95 | 1000 | 7.70 | 9.8E + 11 | 920 | 39.8 | 2050 |
| 90 | 0.50 | 0.98 | 1000 | 7.68 | 9.5E + 11 | 1020 | 38.2 | 1980 |
| 91 | 0.50 | 0.99 | 1000 | 7.59 | 5.6E + 11 | 980 | 38.4 | 1800 |
| 92* | 0.50 | 1.00 | 1000 | 7.54 | 8.9E + 08 | 890 | 22.5 | 450 |
| 93* | 0.50 | 1.10 | 1000 | 6.82 | 8.5E + 08 | 840 | 14.8 | 380 |
| 94*+ | 0.50 | 1.20 | 1000 | 6.53 | 7.8E + 06 | 680 | — | — |

A sample with the sample No. denoted by the mark (*) show that its composition is out of the range of the present invention.

A sample with the sample No. denoted by the mark (+) show that its sintering property is so insufficient that polarization treatment has been impossible.

Table 7 shows that good piezoelectric characteristics can be obtained even by firing at a temperature of as low as 1000° C. in the piezoelectric ceramic compositions (sample Nos. 78 to 91) having a molar ratio z of Mn/Ta of larger than 0.50 and smaller than 1.00.

On the contrary, the sintering density is low and piezoelectric characteristics are deteriorated in the samples (the sample Nos. 76, 77 and 92 to 94) having a molar ratio z of Mn/Ta of 0.50 or less, and 1.00 or more.

EXAMPLE 6

PbO, TiO$_2$, ZrO$_2$, MnO$_2$ and Ta$_2$O$_5$ were blended to be a composition of Pb(Zr$_{1-x}$Ti$_x$)O$_3$+2.0 mol % of {($\beta$MnO$_2$+ (1-$\beta$)/2Ta$_2$O$_5$}. Respective starting material powders of the sample Nos. 95 to 103 were prepared by variously changing the values of x and $\beta$. The molar ratio z of Mn and Ta is represented by z=$\beta$/(1-$\beta$). Disk-shaped piezoelectric ceramics were manufactured by the same method as in Example 1 using these starting material powders.

Figure 13:
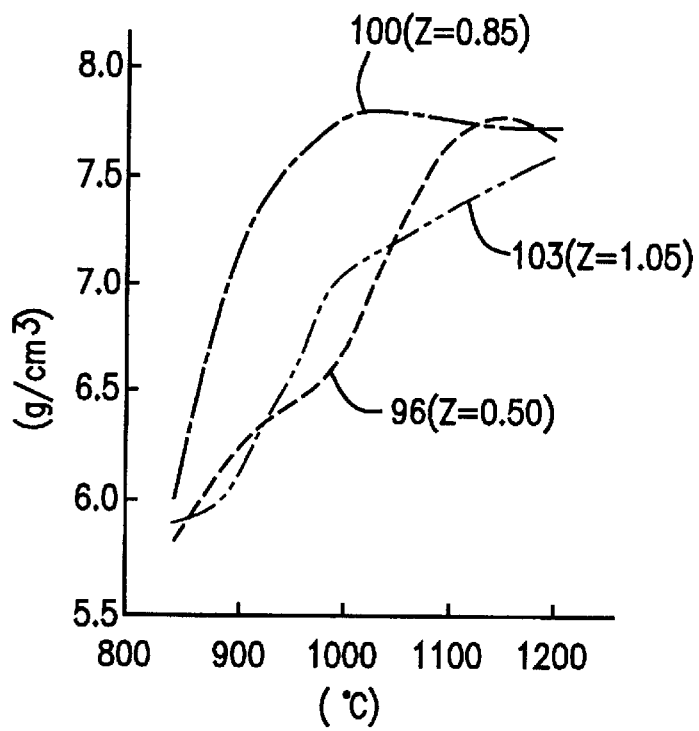
FIG. 13 shows the relation between the firing temperature of the piezoelectric ceramic composition and the sintering density of the piezoelectric member obtained when the molar ratio z of Mn/Ta in Example 6 is changed.

The relations between the firing temperature and the sintering density are shown in FIG. 13, wherein the piezoelectric ceramics as representative examples were obtained from respective starting materials of the sample Nos. 96, 100 and 103.

A sufficient sintering density is not obtained unless the firing temperature is 1100° C. or more in the piezoelectric ceramic composition of the sample No. 96 having the molar ratio z of 0.50. Since the sintering property is further decreased in the sample of the sample No. 103 having a composition with the molar ratio z of 1.00 or more, a sufficient sintering density cannot be obtained unless the ceramic is fired at a temperature of 1200° C. or more. In the sample of the sample No. 100 with the molar ratio z of 0.85, on the contrary, a sufficient sintering density is obtainable even by firing at a temperature of as low as about 1000° C.

Accordingly, the sintering property of the piezoelectric ceramics can be largely improved by adjusting the molar ratio z to be larger than 0.50 and smaller than 1.00 when Mn and Ta are added as sub-components.

Piezoelectric characteristics were also assessed in Example 6 by applying a polarization treatment after forming electrodes on respective piezoelectric ceramics by the same method as in Example 1. The results are shown in Table 8 below.

TABLE 8

| Sample No. | Composition x | z | Firing temperature (° C.) | Sintering density (g/cm$^3$) | Resistivity $\Omega \cdot$ cm | Relative Dielectric Constant | Electromechanical Coupling Coefficient | Mechanical Quality Coefficient |
|---|---|---|---|---|---|---|---|---|
| 95*+ | 0.50 | 0.45 | 1000 | 6.85 | 1.2E + 08 | 520 | — | — |
| 96* | 0.50 | 0.50 | 1000 | 6.98 | 5.6E + 08 | 890 | 18.6 | 300 |
| 97 | 0.50 | 0.51 | 1000 | 7.69 | 1.5E + 12 | 1120 | 48.2 | 2100 |
| 98 | 0.50 | 0.55 | 1000 | 7.78 | 9.8E + 11 | 1060 | 47.5 | 1980 |
| 99 | 0.50 | 0.75 | 1000 | 7.80 | 2.2E + 12 | 1080 | 46.8 | 1900 |
| 100 | 0.50 | 0.85 | 1000 | 7.80 | 2.8E + 12 | 1090 | 45.2 | 1910 |
| 101 | 0.50 | 0.99 | 1000 | 7.84 | 2.5E + 12 | 1040 | 44.8 | 1860 |
| 102* | 0.50 | 1.00 | 1000 | 7.01 | 6.8E + 09 | 980 | 20.8 | 270 |
| 103*+ | 0.50 | 1.05 | 1000 | 6.68 | 4.8E + 08 | 560 | — | — |

A sample with the sample No. denoted by the mark (*) show that its composition is out of the range of the present invention.

A sample with the sample No. denoted by the mark (+) show that its sintering property is so insufficient that polarization treatment has been impossible.

Table 8 shows that good piezoelectric characteristics are obtained in the samples with the compositions (sample Nos. 97 to 101) having the molar ratio z of larger than 0.50 and smaller than 1.00.

A sufficient piezoelectric characteristics cannot be obtained, on the contrary, in the samples with the compositions (the sample Nos. 95 and 96) having the molar ratio z of 0.50 or less, or in the samples with the compositions (the sample Nos. 102 and 103) having the molar ratio z of 1.00 or more.

Accordingly, good piezoelectric characteristics can be obtained even by firing at temperature of as low as about 1000° C., when the molar ratio z is larger than 0.50 and smaller than 1.00.

EXAMPLE 7

PbO, TiO2, ZrO$_2$, Cr$_2$O$_3$ and Ta$_2$O$_5$ as the starting materials were blended to be a composition of 0.95Pb(Zr$_{1-x}$Ti$_x$)O$_3$–0.05Pb(Cr$_y$Ta$_{1-y}$)O$_3$. Respective starting material powders of the sample Nos. 104 to 122 as shown in Table 9 were prepared by variously changing the values of x and y. The value of z in Table 9 shows the molar ratio of Cr and Ta, wherein the relation of z=a/(b+c+d+2e) in the present invention is represented by z=y/(1-y). Disk-shaped piezoelectric ceramics were obtained by the same method as in Example 1, and their piezoelectric characteristics were assessed.

Figure 14:
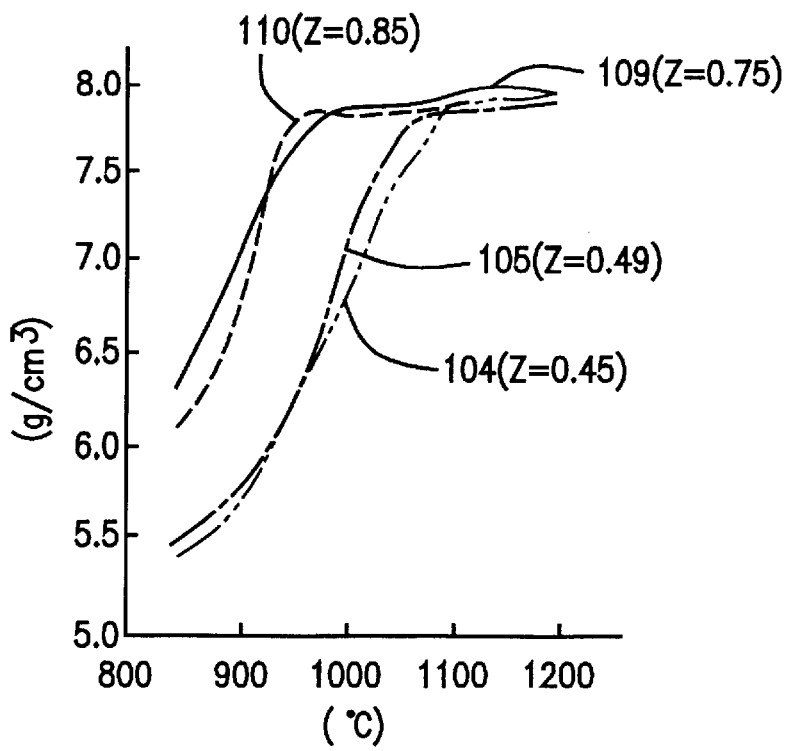
FIG. 14 shows the relation between the firing temperature of the piezoelectric ceramic composition and the sintering density of the piezoelectric member obtained when the molar ratio z of Mn/Ta in Example 7 is changed.
Figure 15:
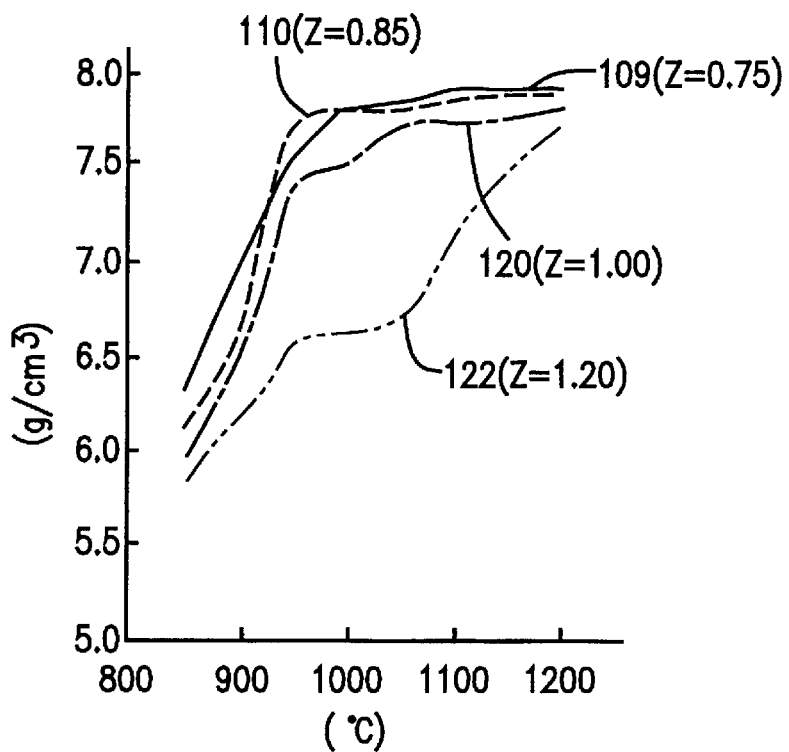
FIG. 15 shows the relation between the firing temperature of the piezoelectric ceramic composition and the sintering density of the piezoelectric member obtained when the molar ratio z of Cr/Ta in Example 7 is changed.

FIGS. 14 and 15 show the relations between the firing temperature and the sintering density of the piezoelectric ceramics in the samples of the sample Nos. 104, 105, 109, 110, 120 and 122 with x=0.50.

As is evident from FIG. 14, a sufficient sintering density cannot be obtained unless the ceramic is fired at a temperature exceeding at least 1100° C. in the samples of the sample Nos. 104 and 105 with the compositions of the molar ratio z of Cr/Ta of 0.50 or less. It is also clear from FIG. 15 that a sufficient sintering density cannot be also obtained in the samples of the sample Nos. 102 and 122 having the molar ratio z of Cr/Ta of 1.00 or more, unless the ceramic is fired at a high temperature as in the samples with the z value of 0.50 or less.

On the contrary, in the sample of the sample Nos. 109 or 110 having the compositions with the z values of 0.75 or 0.85, respectively, a sufficient sintering density is obtainable even by firing at a temperature of as low as about 1000° C. This is because the boundary between the composition range where the sintering property is improved and the composition range where the sintering property is scarcely improved is so clear that a small change in the composition close to the boundary composition causes a large change in the sintering property.

Accordingly, the sintering property of the piezoelectric ceramic composition can be largely improved by adjusting the molar ratio z of Cr/Ta to be larger than 0.50 and smaller than 1.00.

A sample with the sample No. denoted by the mark (*) show that its composition is out of the range of the present invention.

A sample with the sample No. denoted by the mark (+) show that its sintering property is so insufficient that polarization treatment has been impossible.

Table 9 shows that good piezoelectric characteristics are obtainable even by firing at a temperature of as low as 1000° C. in the piezoelectric ceramic compositions (sample Nos. 106 to 119) having the molar ratio z of larger than 0.50 and smaller than 1.00.

The piezoelectric characteristics showed a deterioration in the samples with the compositions of the molar ratio z of Cr/Ta of 0.50 or less or 1.00 or more.

EXAMPLE 8

PbO, $TiO_2$, $ZrO_2$, $Cr_2O_3$ and $Ta_2O_5$ were blended to be a composition of $Pb(Zr_{1-x}Ti_x)O_3 + 2.0$ mol % of $\{\beta/2Cr_2O_3 + (1-\beta)/2Ta_2O_5\}$. Respective starting material powders of the sample Nos. 123 to 131 shown in Table 10 below were prepared by variously changing the values of x and 62. The molar ratio z of Cr and Ta is represented by $z=\beta/(1-\beta)$. Disk-shaped piezoelectric ceramics were manufactured by the same method as in Example 1 using these starting material powders.

Figure 16:
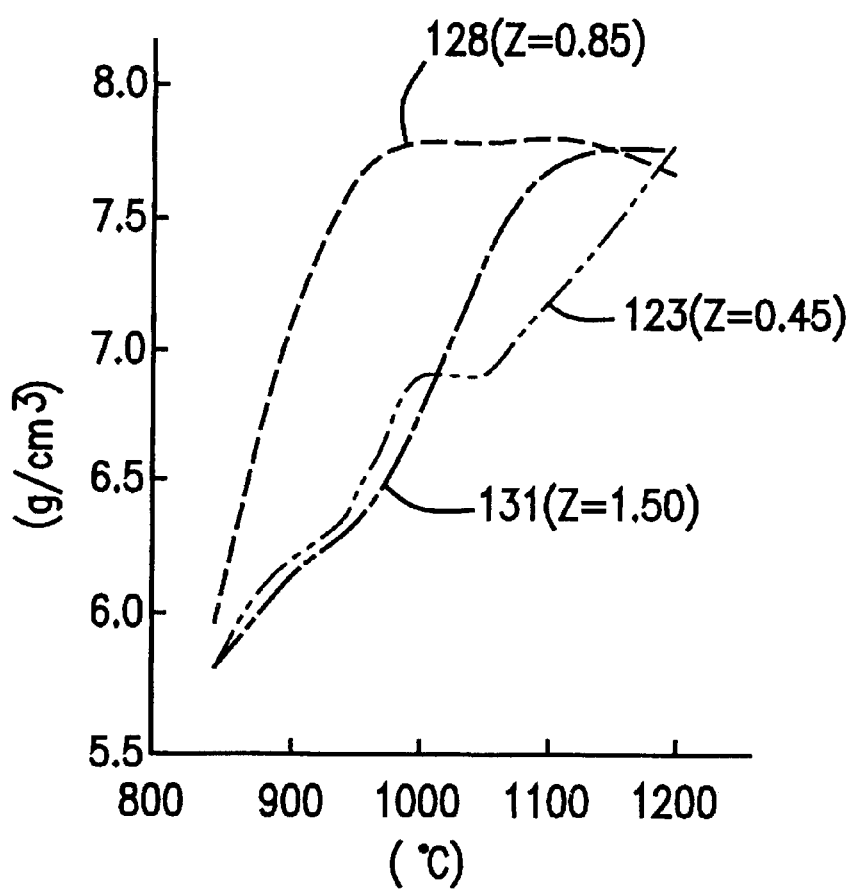
FIG. 16 shows the relation between the firing temperature of the piezoelectric ceramic composition and the sintering density of the piezoelectric member obtained when the molar ratio z of Cr/Ta in Example 8 is changed.

The relations between the firing temperature and the sintering density are shown in FIG. 16, wherein the piezoelectric ceramics obtained from respective compositions of the starting materials of the sample Nos. 123, 128 and 131 with x=0.5 are used as representative examples.

A sufficient sintering density is not obtained unless the firing temperature is 1200° C. or more in the composition of the sample No. 123 having the molar ratio z of 0.50 or less.

TABLE 9

| Sample No. | Composition x | Composition z | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|
| 104*+ | 0.50 | 0.45 | 1000 | 6.75 | 8.2E + 11 | 820 | — | — |
| 105* | 0.50 | 0.49 | 1000 | 6.82 | 5.4E + 11 | 1020 | 20.4 | 58 |
| 106 | 0.50 | 0.50 | 1000 | 7.58 | 5.4E + 11 | 1120 | 38.4 | 135 |
| 107 | 0.50 | 0.55 | 1000 | 7.62 | 6.4E + 11 | 1280 | 39.9 | 160 |
| 108 | 0.50 | 0.60 | 1000 | 7.82 | 7.4E + 11 | 1320 | 40.2 | 140 |
| 109 | 0.50 | 0.75 | 1000 | 7.81 | 1.2E + 11 | 1280 | 49.5 | 159 |
| 110 | 0.50 | 0.85 | 1000 | 7.80 | 5.4E + 11 | 1260 | 48.2 | 201 |
| 111 | 0.46 | 0.90 | 1000 | 7.71 | 5.2E + 11 | 820 | 58.4 | 240 |
| 112 | 0.47 | 0.90 | 1000 | 7.64 | 3.2E + 11 | 1200 | 60.1 | 224 |
| 113 | 0.48 | 0.90 | 1000 | 7.71 | 1.2E + 11 | 1420 | 57.4 | 265 |
| 114 | 0.49 | 0.90 | 1000 | 7.70 | 5.4E + 11 | 1280 | 54.2 | 298 |
| 115 | 0.50 | 0.90 | 1000 | 7.69 | 4.9E + 11 | 1200 | 46.2 | 395 |
| 116 | 0.51 | 0.90 | 1000 | 7.70 | 8.4E + 11 | 980 | 41.9 | 482 |
| 117 | 0.50 | 0.95 | 1000 | 7.68 | 1.2E + 11 | 1090 | 47.1 | 258 |
| 118 | 0.50 | 0.98 | 1000 | 7.61 | 8.2E + 10 | 1080 | 47.2 | 261 |
| 119 | 0.50 | 0.99 | 1000 | 7.42 | 3.2E + 11 | 990 | 45.2 | 215 |
| 120* | 0.50 | 1.00 | 1000 | 7.52 | 3.2E + 09 | 960 | 27.4 | 101 |
| 121* | 0.50 | 1.10 | 1000 | 6.95 | 9.8E + 08 | 860 | 19.8 | 32 |
| 122*+ | 0.50 | 1.20 | 1000 | 6.62 | 9.9E + 06 | 790 | — | — |

A sufficient firing temperature is not also obtainable in the composition of the sample No. 131 with the molar ratio z of 1.00 or more, unless the firing temperature is 1200° C. or more. In the composition of the sample No. 128 with the molar ratio z of 0.85, on the contrary, a sufficient sintering density is obtained even by firing at a temperature of as low as about 1000° C.

Accordingly, it is evident that the sintering property of the piezoelectric ceramics can be largely improved by adjusting the molar ratio z to be larger than 0.50 and smaller than 1.00, when Cr and Ta are added as sub-components in the piezoelectric ceramic composition comprising $Pb(Zr_{1-x}Ti_x)O_3$ as a principal component.

Piezoelectric characteristics were also assessed in Example 8 by polarizing each piezoelectric ceramic after forming electrodes on respective piezoelectric ceramics by the same method as in Example 1. The results are shown in Table 10 below.

TABLE 10

| Sample No. | Composition x | z | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|
| 123*+ | 0.50 | 0.45 | 1000 | 6.92 | 9.9E + 07 | 540 | — | — |
| 124* | 0.50 | 0.49 | 1000 | 7.12 | 2.8E + 08 | 960 | 19.8 | 75 |
| 125 | 0.50 | 0.50 | 1000 | 7.71 | 6.4E + 11 | 1300 | 54.1 | 130 |
| 126 | 0.50 | 0.55 | 1000 | 7.81 | 8.4E + 11 | 1240 | 53.2 | 190 |
| 127 | 0.50 | 0.75 | 1000 | 7.79 | 6.4E + 11 | 1250 | 52.2 | 204 |
| 128 | 0.50 | 0.85 | 1000 | 7.84 | 6.5E + 11 | 1220 | 51.2 | 208 |
| 129 | 0.50 | 0.95 | 1000 | 7.81 | 5.2E + 11 | 1200 | 50.2 | 252 |
| 130* | 0.50 | 1.00 | 1000 | 7.42 | 8.4E + 09 | 1020 | 23.2 | 79 |
| 131*+ | 0.50 | 1.05 | 1000 | 6.74 | 5.1E + 08 | 450 | — | — |

A sample with the sample No. denoted by the mark (*) show that its composition is out of the range of the present invention.

A sample with the sample No. denoted by the mark (+) show that its sintering property is so insufficient that polarization treatment has been impossible.

As is evident from Table 10, good piezoelectric characteristics are obtained in the compositions (the sample Nos. 125 to 129) having the molar ratio z of larger than 0.50 and smaller than 1.00.

Sufficient piezoelectric characteristics are not obtainable, on the contrary, when the composition of the sample No. 124 having the molar ratio z of less than 0.50 or the composition of the sample No. 130 having the molar ratio z of more than 1.00 is used.

Accordingly, sufficient piezoelectric characteristics are obtained even by firing at a temperature of as low as about 1000° C. by adjusting the molar ratio z to be larger than 0.50 and less than 1.00.

EXAMPLE 9

Powders of PbO, $TiO_2$, $ZrO_2$, $MnO_2$, $Nb_2O_5$ and $SiO_2$ were blended to be a composition of $0.95Pb(Zr_{1-x}Ti_x)O_3$–$0.05Pb(Mn_yNb_{1-y})O_3$+v % by weight of $SiO_2$ as a starting material. The starting material powders of the sample Nos. 132 to 156 shown in Tables 11 and 12 were prepared by variously changing the values of x, y and v. The molar ratio z of Mn and Nb, or the value of z=a/(b+c+d+2e) in the present invention, is represented by y/(1-y).

Disk-shaped piezoelectric ceramics were obtained by the same method as in Example 1, and their piezoelectric characteristics were assessed.

Figure 17:
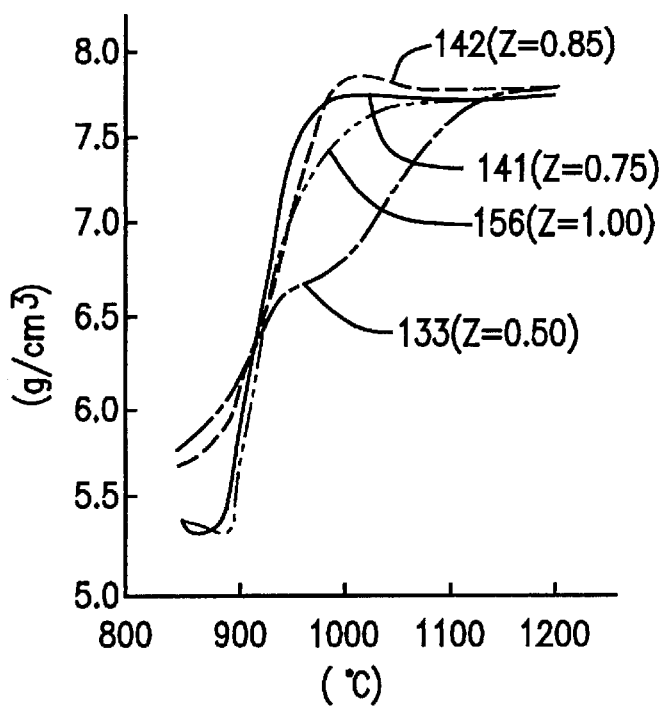
FIG. 17 shows the relation between the firing temperature of the piezoelectric ceramic composition and the sintering density of the piezoelectric member obtained when the molar ratio z of Mn/Nb in Example 9 is changed.

The relations between the firing temperature and the sintering density of the piezoelectric ceramics are shown in FIG. 17, wherein the piezoelectric ceramics obtained from respective starting materials of the sample Nos. 141, 142 and 156 with x=0.5% by weight and v=0.02% by weight were used as representative examples of the piezoelectric resonators using the starting materials of the sample Nos. 132 to 156.

The results show that a sufficient sintering density cannot be obtained unless the ceramics are fired at a temperature exceeding 1200° C. when the starting materials of the sample No. 133 with the molar ratio z of 0.50 is used. A sufficient sintering density cannot be also obtained unless the ceramics are fired at a temperature exceeding 1100° C. when the starting materials of the sample No. 156 with the molar ratio z of 1.00 is used.

On the contrary, the sintering density is sufficiently enhanced even by firing at a temperature of as low as about 1000° C. when the starting materials of the sample Nos. 141 and 142 corresponding to the examples of the present invention are used.

The results as described above were obtained because the boundary between the composition range where the sintering property is improved and the composition range where the sintering property is scarcely improved is so clear that a small change of the composition close to the boundary composition causes a large difference in the sintering property.

Accordingly, the sintering property of the piezoelectric ceramics may be largely improved by adjusting the molar ratio z of Mn/Nb to be larger than 0.50 and smaller than 1.00.

TABLE 11

$0.95 PbZr_{(1-x)}Ti_xO_3$ – $0.05Pb (Mn_yNb_{(1-y)})O_3$ + v (% by weight) $SiO_2$

| Sample No. | Composition x | z | v (% by weight) | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| 132* | 0.50 | 0.45 | 0.020 | 1000 | 6.71 | 3.1E + 08 | 480 | 11.2 | 410 |
| 133* | 0.50 | 0.50 | 0.020 | 1000 | 6.82 | 5.8E + 08 | 720 | 7.5 | 300 |
| 134 | 0.50 | 0.51 | 0.005 | 1000 | 7.71 | 8.4E + 11 | 980 | 40.3 | 1840 |
| 135 | 0.50 | 0.51 | 0.010 | 1000 | 7.72 | 8.9E + 11 | 990 | 41.2 | 1880 |

TABLE 11-continued $0.95\ PbZr_{(1-x)}Ti_xO_3 - 0.05Pb\ (Mn_yNb_{(1-y)})O_3 + v\ (\%\ by\ weight)\ SiO_2$

| Sample No. | Composition | | | Firing temperature (°C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 136 | 0.50 | 0.51 | 0.020 | 1000 | 7.69 | 9.4E + 11 | 1010 | 41.5 | 1920 |
| 137 | 0.50 | 0.51 | 0.050 | 1000 | 7.71 | 8.3E + 11 | 1020 | 41.2 | 1940 |
| 138 | 0.50 | 0.51 | 0.100 | 1000 | 7.72 | 8.2E + 11 | 1030 | 40.5 | 1950 |
| 139 | 0.50 | 0.55 | 0.020 | 1000 | 7.71 | 6.5E + 11 | 990 | 40.5 | 1850 |
| 140 | 0.50 | 0.60 | 0.020 | 1000 | 7.75 | 7.3E + 11 | 980 | 39.8 | 2350 |
| 141 | 0.50 | 0.75 | 0.020 | 1000 | 7.75 | 6.3E + 11 | 970 | 39.7 | 2340 |
| 142 | 0.50 | 0.85 | 0.020 | 1000 | 7.80 | 1.9E + 12 | 980 | 39.4 | 2300 |
| 143 | 0.46 | 0.90 | 0.020 | 1000 | 7.81 | 1.3E + 12 | 680 | 44.2 | 1990 |
| 144 | 0.47 | 0.90 | 0.020 | 1000 | 7.72 | 9.9E + 11 | 880 | 48.6 | 2010 |

TABLE 12

$0.95\ PbZr_{(1-x)}Ti_xO_3 - 0.05Pb\ (Mn_yNb_{(1-y)})O_3 + v\ (\%\ by\ weight)\ SiO_2$

| Sample No. | Composition | | | Firing temperature (°C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 145 | 0.48 | 0.90 | 0.020 | 1000 | 7.76 | 5.8E + 11 | 1240 | 50.4 | 1870 |
| 146 | 0.49 | 0.90 | 0.020 | 1000 | 7.70 | 1.0E + 12 | 1070 | 42.5 | 1750 |
| 147 | 0.50 | 0.90 | 0.020 | 1000 | 7.83 | 4.2E + 11 | 980 | 38.6 | 2370 |
| 148 | 0.51 | 0.90 | 0.020 | 1000 | 7.74 | 5.5E + 11 | 950 | 38.2 | 2400 |
| 149 | 0.50 | 0.95 | 0.020 | 1000 | 7.70 | 6.3E + 11 | 940 | 37.9 | 2510 |
| 150 | 0.50 | 0.98 | 0.020 | 1000 | 7.68 | 6.2E + 11 | 920 | 37.7 | 2480 |
| 151 | 0.50 | 0.99 | 0.005 | 1000 | 7.60 | 6.4E + 11 | 980 | 38.9 | 2050 |
| 152 | 0.50 | 0.99 | 0.020 | 1000 | 7.59 | 4.1E + 11 | 920 | 37.9 | 2200 |
| 153 | 0.50 | 0.99 | 0.040 | 1000 | 7.60 | 6.3E + 11 | 950 | 38.1 | 2100 |
| 154 | 0.50 | 0.99 | 0.080 | 1000 | 7.61 | 7.1E + 11 | 960 | 38.0 | 2110 |
| 155 | 0.50 | 0.99 | 0.100 | 1000 | 7.60 | 7.3E + 11 | 950 | 37.9 | 2190 |
| 156* | 0.50 | 1.00 | 0.020 | 1000 | 7.54 | 8.2E + 11 | 890 | 22.5 | 140 |

A sample with the sample No. denoted by the mark (*) show that its composition is out of the range of the present invention.

Tables 11 and 12 show that good piezoelectric characteristics can be obtained even by firing at a temperature of as low as 1000° C. in the piezoelectric ceramic compositions (sample Nos. 134 to 155) having the molar ratio z of Mn/Nb of larger than 0.50 and smaller than 1.00. The sintering density was low and piezoelectric characteristics were deteriorated when the molar ratio z of Mn/Nb is 0.50 or less or 1.00 or more (the sample Nos. 132, 133 and 156).

EXAMPLE 10

PbO, TiO$_2$, ZrO$_2$, MnO$_2$, Nb$_2$O$_5$ and SiO$_2$ were blended to be a composition of Pb(Zr$_{1-x}$Ti$_x$)O$_3$+2.0 mol % of {βMnO$_2$+(1-β)/2Nb$_2$O$_5$}+v % by weight of SiO$_2$. Respective starting material powders of the sample Nos. 157 to 167 shown in Table 13 below were prepared by variously changing the values of x, and v. The molar ratio of Mn and Nb is represented by z=β/(1-β). Disk-shaped piezoelectric ceramics were manufactured by the method as in Example 1 using the starting material powders above.

Figure 18:
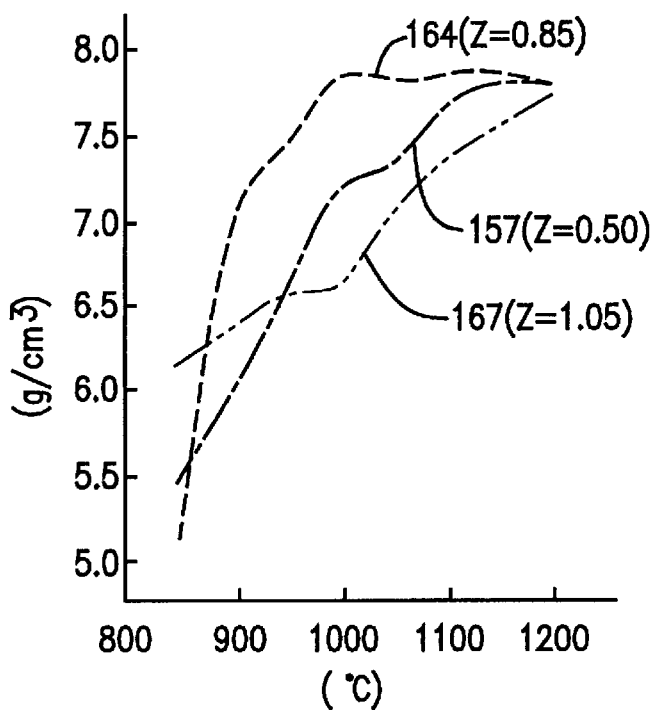
FIG. 18 shows the relation between the firing temperature of the piezoelectric ceramic composition and the sintering density of the piezoelectric member obtained when the molar ratio z of Mn/Nb in Example 10 is changed.

The relations between the firing temperature and the sintering density of the piezoelectric ceramics are shown in FIG. 18 as representative examples, wherein the piezoelectric ceramics were obtained from the starting materials of the sample Nos. 157, 164 and 167 with x=0.5% by weight and y=0.05% by weight.

A sufficient sintering density is not obtainable unless the ceramic is fired at 1200° C. or more in the piezoelectric ceramic composition of the sample No. 157 with the molar ratio z of 0.50. A sufficient sintering density cannot be also obtained unless the ceramic is fired at 1200° C. or more in the composition of the sample No. 167 with the molar ratio z of 1 or more. A sufficient sintering density is obtainable, on the contrary, even by firing at a temperature of as low as about 1000° C. in the composition of the sample No. 164 with thee molar ratio z of 0.85.

Accordingly, the sintering property of the piezoelectric ceramics can be largely improved by adjusting the molar ratio z to be larger than 0.50 and smaller than 1.00, when Mn and Nb are added as sub-components.

Piezoelectric characteristics were also assessed in Example 10 by polarizing each piezoelectric ceramic after forming electrodes on respective piezoelectric ceramics by the same method as in Example 1. The results are shown in Table 13 below.

TABLE 13

$PbZr_{(1-x)}Ti_xO_3 + 2\ mol\ \%\ (\beta\ MnO_2 + \{(1-\beta)/2\}\ Nb_2O_3) + v\ (\%\ by\ weight)\ SiO_2$

| Sample No. | Composition x | z | v (% by weight) | Firing temperature (°C.) | Sintering density (g/cm³) | Relative Resistivity Ω·cm | Dielectric Constant | Electromechanical Coupling Coefficient | Mechanical Quality Coefficient |
|---|---|---|---|---|---|---|---|---|---|
| 157*+ | 0.50 | 0.45 | 0.050 | 1000 | 6.75 | 9.5E + 07 | 520 | — | — |
| 158* | 0.50 | 0.50 | 0.050 | 1000 | 7.15 | 4.2E + 08 | 890 | 6.3 | 480 |
| 159 | 0.50 | 0.51 | 0.005 | 1000 | 7.74 | 5.3E + 10 | 1100 | 39.2 | 2120 |
| 160 | 0.50 | 0.51 | 0.050 | 1000 | 7.72 | 9.1E + 11 | 1120 | 40.2 | 2090 |
| 161 | 0.50 | 0.51 | 1000 | 1000 | 7.81 | 1.2E + 12 | 1130 | 41.0 | 2100 |
| 162 | 0.50 | 0.55 | 0.050 | 1000 | 7.79 | 8.2E + 11 | 1060 | 40.8 | 2010 |
| 163 | 0.50 | 0.75 | 0.050 | 1000 | 7.82 | 3.4E + 11 | 1080 | 41.5 | 1950 |
| 164 | 0.50 | 0.85 | 0.050 | 000 | 7.82 | 1.2E + 11 | 1020 | 39.8 | 1980 |
| 165 | 0.50 | 0.99 | 0.050 | 1000 | 7.79 | 6.5E + 11 | 990 | 38.5 | 2120 |
| 166* | 0.50 | 1.00 | 0.050 | 1000 | 6.85 | 3.2E + 09 | 680 | 18.2 | 280 |
| 167*+ | 0.50 | 1.05 | 0.050 | 1000 | 6.60 | 9.1E + 07 | 480 | — | — |

The sample with the sample No. denoted by the mark (*) show that its composition is out of the range of the present invention.

The sample with the sample No. denoted by the mark (+) show that its sintering property is so insufficient that polarization treatment has been impossible.

Table 13 shows that good piezoelectric characteristics can be obtained in the composition (the sample Nos. 159 to 165) with the molar ratio z of larger than 0.50 and smaller than 1.00.

On the contrary, sufficient piezoelectric characteristics are not obtainable when the composition (the sample No. 158) with the molar ratio z of 0.50 or less or the composition (the sample No. 166) with the molar ratio z of 1.00 or more is used.

Accordingly, good piezoelectric characteristics can be obtained even by firing at a temperature of as low as about 1000 C when the piezoelectric ceramic composition has a molar ratio z of larger than 0.50 and smaller than 1.00.

EXAMPLE 11

$PbO$, $TiO_2$, $ZrO_2$, $Cr_2O_3$, $Nb_2O_5$ and $SiO_2$ were blended to be a composition of $0.95Pb(Zr_{1-x}Ti_x)O_3-0.05Pb(Cr_yNb_{1-y})_3+v$ % by weight of $SiO_2$ as a starting material. Respective starting material powders of the sample Nos. 168 to 192 shown in Tables 14 and 15 were prepared by various changing the values of x, y and v. The z values in Table 14 and 15, or z=a/(b+c+d+2e) in the present invention, shows the molar ratio of Cr and Nb and is represented by z=y/(1−y). Disk-shaped piezoelectric ceramics were obtained by the same method as in Example 1, and their piezoelectric characteristics were assessed.

Figure 19:
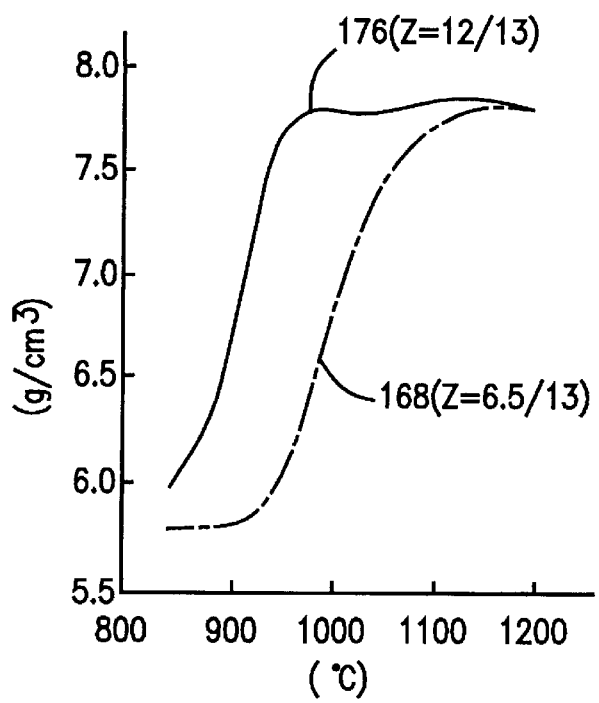
FIG. 19 shows the relation between the firing temperature of the piezoelectric ceramic composition and the sintering density of the piezoelectric member obtained when the molar ratio z of Mn/Nb in Example 11 is changed.
Figure 20:
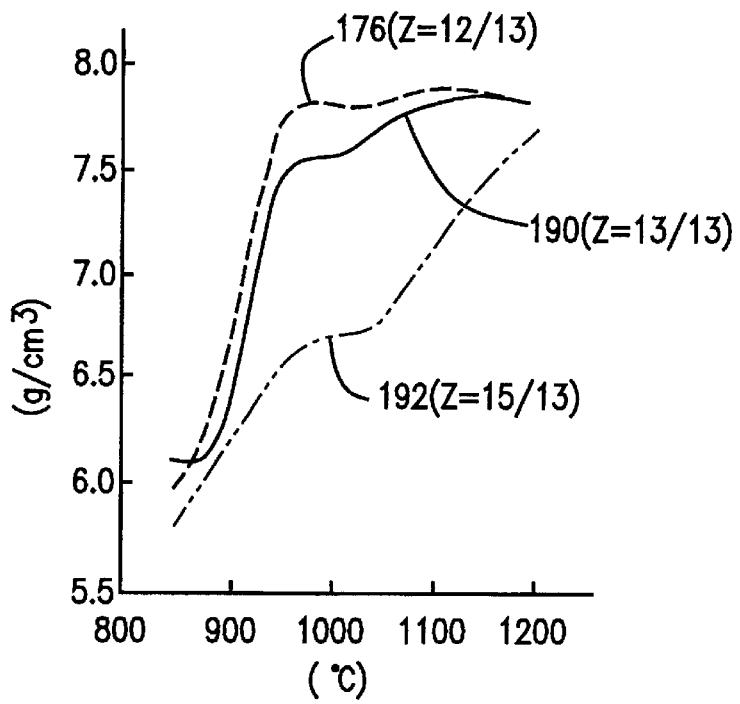
FIG. 20 shows the relation between the firing temperature of the piezoelectric ceramic composition and the sintering density of the piezoelectric member obtained when the molar ratio z of Cr/Nb in Example 11 is changed.

FIGS. 19 and 20 show the relations between the firing temperature and the sintering density of the piezoelectric ceramics obtained in the samples with the sample Nos. 168, 176, 190 and 192 with x=0.50% by weight and v=0.02% by weight.

FIG. 19 shows that a sufficient sintering density cannot be obtained unless the ceramic is fired at a temperature exceeding at least 1000° C. in the samples of the sample No. 168 having the compositions with the molar ratio z of Cr/Nb of 6.5/13 or less. FIG. 20 also shows that a high sintering density cannot be obtained unless the ceramic is fired at a temperature of as high as 1200° C. or more in the samples of the sample Nos. 190 and 192 with the molar ratio z of Cr/Nb of 1.00 or more.

A sufficient sintering density is obtainable, on the contrary, even by firing at a temperature of as low as about 1000° C. in the sample of the sample No. 176 having a composition of the molar ratio z of 12/13. This is because the boundary between the composition range where the sintering property is improved and the composition range where the sintering property is scarcely improved is so clear that a small change in the composition causes a large difference in the sintering property.

Accordingly, the sintering property of the piezoelectric ceramic composition can be largely improved by adjusting the molar ratio z of Cr/Nb to be larger than 6.5/13 and smaller than 1.00.

TABLE 14

$0.95\ PbZr_{(1-x)}Ti_xO_3 - 0.05Pb(Cr_yNb_{(1-y)})O_3 + v\ (\%\ by\ weight)\ SiO_2$

| Sample No. | Composition x | z | v (% by weight) | Firing temperature (°C.) | Sintering density (g/cm³) | Relative Resistivity Ω·cm | Dielectric Constant | Electromechanical Coupling Coefficient | Mechanical Quality Coefficient |
|---|---|---|---|---|---|---|---|---|---|
| 168*+ | 0.50 | 6.5/13 | 0.020 | 1000 | 6.74 | 7.9E + 07 | 520 | — | — |
| 169 | 0.50 | 10/13 | 0.020 | 1000 | 7.58 | 6.4E + 10 | 920 | 33.4 | 185 |
| 170 | 0.50 | 11/13 | 0.020 | 1000 | 7.59 | 9.5E + 10 | 1050 | 34.6 | 198 |
| 171 | 0.50 | 11.5/13 | 0.005 | 1000 | 7.59 | 1.2E + 11 | 1190 | 35.8 | 200 |
| 172 | 0.50 | 11.5/13 | 0.010 | 1000 | 7.61 | 3.9E + 11 | 1200 | 36.2 | 210 |
| 173 | 0.50 | 11.5/13 | 0.020 | 1000 | 7.69 | 7.4E + 11 | 1210 | 38.2 | 190 |
| 174 | 0.50 | 11.5/13 | 0.050 | 1000 | 7.70 | 9.3E + 11 | 1220 | 38.4 | 210 |

TABLE 14-continued 0.95 PbZr$_{(1-x)}$Ti$_x$O$_3$ − 0.05Pb(Cr$_y$Nb$_{(1-y)}$)O$_3$ + v (% by weight) SiO$_2$

| | Composition | | Firing | Sintering | | Relative | | Mechanical |
|---|---|---|---|---|---|---|---|---|
| Sample No. | x | z | v (% by weight) | temperature (° C.) | density (g/cm$^3$) | Resistivity $\Omega \cdot$ cm | Dielectric Constant | Electromechanical Coupling Coefficient | Quality Coefficient |
| 175 | 0.50 | 11.5/13 | 0.100 | 1000 | 7.69 | 8.2E + 11 | 1190 | 37.9 | 220 |
| 176 | 0.50 | 12/13 | 0.020 | 1000 | 7.74 | 7.9E + 11 | 1230 | 36.8 | 228 |
| 177 | 0.50 | 12.5/13 | 0.020 | 1000 | 7.81 | 8.0E + 11 | 1220 | 35.8 | 243 |
| 178 | 0.50 | 12.8/13 | 0.020 | 1000 | 7.80 | 8.4E + 11 | 1200 | 46.8 | 251 |
| 179 | 0.50 | 12.9/13 | 0.020 | 1000 | 7.80 | 8.4E + 11 | 1180 | 45.2 | 325 |

TABLE 15

0.95 PbZr$_{(1-x)}$Ti$_x$O$_3$ − 0.05Pb(Cr$_y$Nb$_{(1-y)}$)O$_3$ + v (% by weight) SiO$_2$

| | Composition | | Firing | Sintering | | Relative | | Mechanical |
|---|---|---|---|---|---|---|---|---|
| Sample No. | x | z | v (% by weight) | temperature (° C.) | density (g/cm$^3$) | Resistivity $\Omega \cdot$ cm | Dielectric Constant | Electromechanical Coupling Coefficient | Quality Coefficient |
| 180 | 0.46 | 12/13 | 0.020 | 1000 | 7.78 | 7.9E + 11 | 730 | 54.2 | 260 |
| 181 | 0.47 | 12/13 | 0.020 | 1000 | 7.79 | 6.8E + 11 | 1180 | 56.4 | 275 |
| 182 | 0.48 | 12/13 | 0.020 | 1000 | 7.78 | 5.4E + 11 | 1430 | 54.2 | 280 |
| 183 | 0.49 | 12/13 | 0.020 | 1000 | 7.72 | 6.3E + 11 | 1340 | 52.4 | 345 |
| 184 | 0.51 | 12/13 | 0.020 | 1000 | 7.75 | 8.2E + 11 | 1220 | 43.1 | 512 |
| 185 | 0.50 | 12.5/13 | 0.005 | 1000 | 7.61 | 1.3E + 11 | 1180 | 40.2 | 385 |
| 186 | 0.50 | 12.5/13 | 0.010 | 1000 | 7.68 | 5.5E + 11 | 1190 | 42.1 | 396 |
| 187 | 0.50 | 12.5/13 | 0.020 | 1000 | 7.72 | 8.5E + 11 | 1120 | 42.2 | 401 |
| 188 | 0.50 | 12.5/13 | 0.050 | 1000 | 7.72 | 9.0E + 11 | 1140 | 42.0 | 419 |
| 189 | 0.50 | 12.5/13 | 0.100 | 1000 | 7.71 | 5.2E + 11 | 1130 | 40.5 | 399 |
| 190* | 0.50 | 13/13 | 0.020 | 1000 | 7.54 | 8.2E + 09 | 1020 | 27.8 | 98 |
| 191* | 0.50 | 14/13 | 0.020 | 1000 | 6.85 | 5.2E + 07 | 790 | 18.2 | 32 |
| 192*+ | 0.50 | 15/13 | 0.020 | 1000 | 6.52 | 7.4E + 06 | 540 | — | — |

A sample with the sample No. denoted by the mark (*) show that its composition is out of the range of the present invention.

A sample with the sample No. denoted by the mark (+) show that its sintering property is so insufficient that polarization treatment has been impossible.

Table 14 and 15 show that good piezoelectric characteristics are obtained even by firing at a temperature of as low as 1000° C. in the piezoelectric ceramic compositions (the sample Nos. 169 to 189) having the molar ratio z of Cr/Nb of larger than 6.5/13 and smaller than 1.00.

The sintering density was low and piezoelectric characteristics were deteriorated in the compositions (the sample Nos. 168, 190 and 191) with the molar ratio z of 6.5/13 or less or 1.00 or more.

EXAMPLE 12

PbO, TiO$_2$, ZrO$_2$, Cr$_2$O$_3$, Nb$_2$O$_5$ and SiO$_2$ were blended to be a composition of Pb(Zr$_{1-x}$Ti$_x$)O$_3$+2.0 mol % of {β/2Cr$_2$O$_3$+(1−β)/2Nb$_2$O$_5$}+v % by weight of SiO$_2$. Respective starting material powders of the sample Nos. 193 to 203 shown in Table 16 below were prepared by variously changing the values of x, b and v. The molar ratio of Cr and Nb is represented by z=β/(1−β). Disk-shaped piezoelectric ceramics were manufactured by the method as in Example 1 using these staring material powders.

Figure 21:
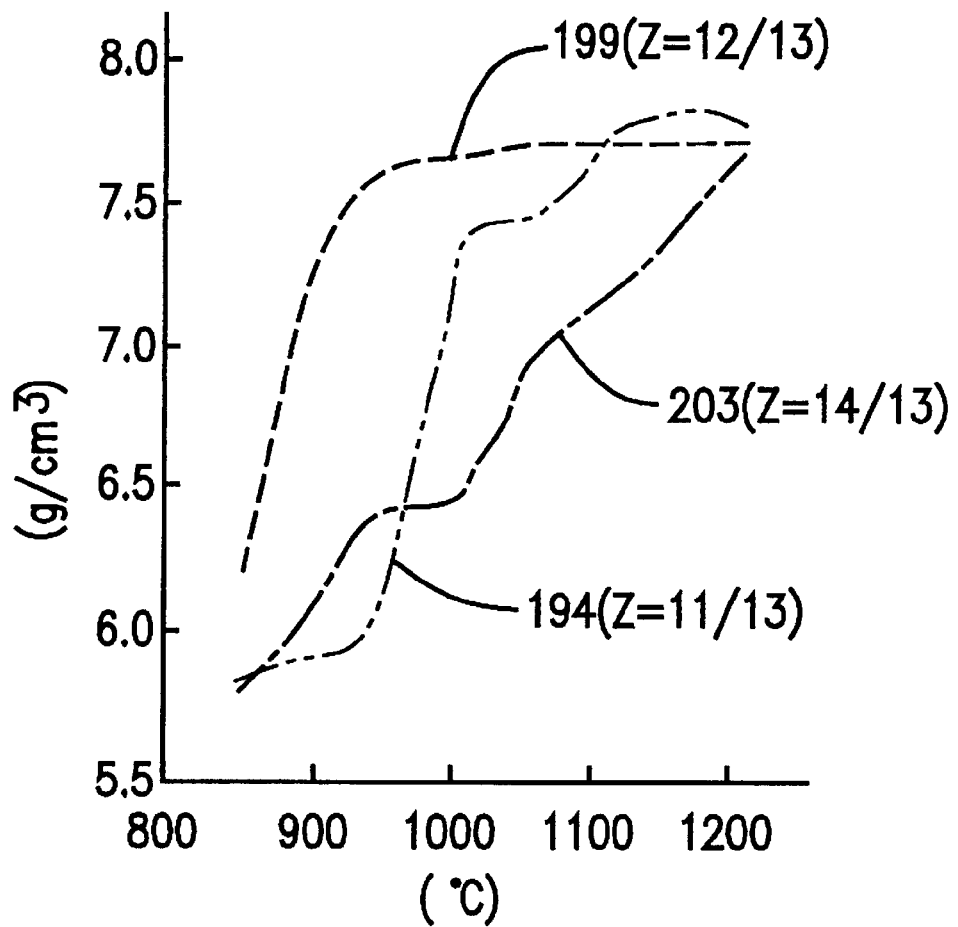
FIG. 21 shows the relation between the firing temperature of the piezoelectric ceramic composition and the sintering density of the piezoelectric member obtained when the molar ratio z of Cr/Nb in Example 12 is changed.

FIG. 21 shows the relations between the firing temperature and sintering density as representative examples of the piezoelectric ceramics obtained from each composition of the starting materials of the sample Nos. 194, 199 and 203 with x=0.5% by weight and v=0.02% by weight.

A sufficient sintering density cannot be obtained unless the ceramic is fired at a temperature of 1200° C. or more in the composition of the sample No. 203 with the molar ratio z of 1.00 or more. A sufficient sintering density is obtainable, on the contrary, even by firing at a temperature of as low as about 950° C. in the composition of the sample No. 199 with he molar ratio z of 12/13. A sufficient sintering density can be obtained under a firing temperature of about 1000° C. in the composition of the sample No. 194 with the molar ratio z of 11/13. The increase in sintering density is apparent in comparison with sample No. 203.

Accordingly, the sintering property can be largely improved by adjusting the molar ratio z to be larger than 11/13 and smaller than 1.00, when Cr and Nb are added as sub-components into the piezoelectric ceramic composition containing Pb(Zr$_{1-x}$Ti$_x$)O$_3$ as a principal component.

Piezoelectric characteristics were also assessed in Example 12 by polarizing each piezoelectric ceramic after forming electrodes on respective piezoelectric ceramics by the same method as in Example 1. The results are shown in Table 16 below.

TABLE 16

Pb(Zr$_{(1-x)}$Ti$_x$)O$_3$ + 2 mol % {($\beta$/2)Cr$_2$O$_3$ + ((1 − $\beta$)/2)Nb$_2$O$_5$} + v (% by weight)
SiO$_2$, O$_3$ − 0.05Pb(Cr$_y$Nb$_{(1-y)}$)O$_3$ + v (% by weight) SiO$_2$

| Sample No. | Composition | | | Firing temperature (° C.) | Sintering density (g/cm$^3$) | Resistivity $\Omega \cdot$ cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 193* | 0.50 | 6.5/13 | 0.050 | 1000 | 7.01 | 2.1E + 08 | 930 | 18.8 | 52 |
| 194 | 0.50 | 11/13 | 0.050 | 1000 | 7.52 | 9.2E + 10 | 1200 | 50.9 | 148 |
| 195 | 0.50 | 11.1/13 | 0.005 | 1000 | 7.69 | 1.2E + 11 | 1290 | 51.9 | 169 |
| 196 | 0.50 | 11.1/13 | 0.050 | 1000 | 7.72 | 6.2E + 11 | 1320 | 53.2 | 145 |
| 197 | 0.50 | 11.1/13 | 0.100 | 1000 | 7.71 | 5.8E + 11 | 1300 | 52.9 | 198 |
| 198 | 0.50 | 11.4/13 | 0.050 | 1000 | 7.75 | 7.8E + 11 | 1280 | 51.4 | 216 |
| 199 | 0.50 | 12/13 | 0.050 | 1000 | 7.74 | 9.4E + 11 | 1260 | 50.8 | 231 |
| 200 | 0.50 | 12.5/13 | 0.050 | 1000 | 7.76 | 2.3E + 11 | 1180 | 48.2 | 254 |
| 201 | 0.50 | 12.8/13 | 0.050 | 1000 | 7.75 | 1.2E + 11 | 1050 | 46.2 | 312 |
| 202* | 0.50 | 13/13 | 0.050 | 1000 | 7.52 | 9.6E + 09 | 950 | 20.3 | 102 |
| 203*+ | 0.50 | 14/13 | 0.050 | 1000 | 6.54 | 2.1E + 07 | 740 | — | — |

A sample with the sample No. denoted by the mark (*) show that its composition is out of the range of the present invention.

A sample with the sample No. denoted by the mark (+) show that its sintering property is so insufficient that polarization treatment has been impossible. Table 16 shows that good piezoelectric characteristics are obtainable in the compositions (the sample Nos. 195 to 201) with the molar ratio z of larger than 6.5/13 and smaller than 1.00.

Sufficient piezoelectric characteristics cannot be obtained, on the contrary, when the compositions of the sample Nos. 193 and 194 with the molar ratio z of 6.5/13 or less, or the composition of the sample No. 202 with the molar ratio z of 1.00 or more is used.

Accordingly, sufficient piezoelectric characteristics can be obtained even by firing at a temperature of as low as about 1000° C. when the piezoelectric ceramic composition has a molar ratio z of larger than 11/13 and smaller than 1.00.

EXAMPLE 13

Powders of PbO, TiO$_2$, ZrO$_2$, MnO$_2$, WO$_3$ and SiO$_2$ were blended to be a composition of 0.95Pb(Zr$_{1-x}$Ti$_x$)O$_3$–0.05Pb (Mn$_y$W$_{1-y}$)O$_3$+v % by weight of SiO$_2$ as starting materials. Starting material powders of the sample Nos. 204 to 229 shown in Table 17 below were prepared by variously changing the values of x, y and v. The molar ratio z of Mn and W, or the relation of z=a/(b+c+d+2e) in the present invention, is represented by y/2(1−y).

Disk-shaped piezoelectric ceramics were obtained by the same method as in Example 1, and their piezoelectric characteristics were assessed.

Figure 22:
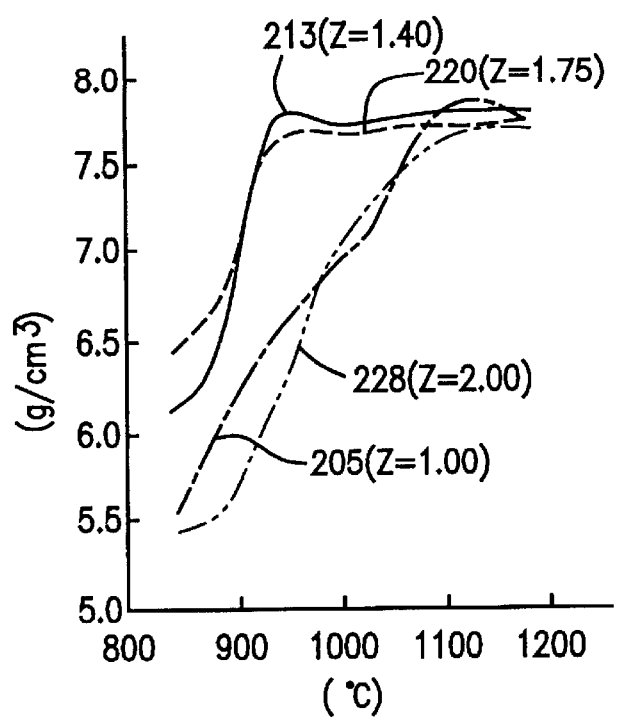
FIG. 22 shows the relation between the firing temperature of the piezoelectric ceramic composition and the sintering density of the piezoelectric member obtained when the molar ratio z of Mn/W in Example 13 is changed.

FIG. 22 shows the relations between the firing temperature and sintering density of the piezoelectric ceramics obtained from each starting material of the sample Nos. 205, 213, 220 and 228 with x=0.5% by weight and v=0.02% by weight as representative examples of the piezoelectric resonators using the starting materials of the sample Nos. 401 to 435.

The results show that a sufficient sintering density cannot be obtained unless the ceramic is fired at a temperature exceeding 1200° C. when the starting material of the sample No. 205 with the molar ratio Mn/W of 1.0 (z=0.5) is used. A sufficient sintering density cannot be also obtained unless the ceramic is fired at a temperature of as high as 1200° C. or more when the starting material of the sample No. 228 with the molar ratio Mn/W of 2.0 or more is used. The sintering density can be sufficiently enhanced, on the contrary, even by firing at a temperature of as low as 940° C. when the starting materials of the sample Nos. 213 and 220 corresponding to the example of the present invention are used.

The results as described above are obtained because the boundary between the composition range where the sintering property is improved and the composition range where the sintering property is scarcely improved is so clear that a small change in the composition close to the boundary composition causes a large change in the sintering property.

Accordingly, the sintering property of the piezoelectric ceramic can be largely improved by adjusting the molar ratio of Mn/W to be larger than 1.0 and smaller than 2.0.

TABLE 17

| Sample No. | Composition | | | Firing temperature (° C.) | Sintering density (g/cm$^3$) | Resistivity $\Omega \cdot$ cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 204*+ | 0.50 | 0.48 | 0.020 | 1000 | 6.42 | 7.1E + 07 | 490 | — | — |
| 205* | 0.50 | 0.50 | 0.020 | 1000 | 6.87 | 4.2E + 08 | 520 | 20.2 | 340 |
| 206 | 0.50 | 0.51 | 0.005 | 1000 | 7.65 | 1.2E + 11 | 1120 | 47.2 | 1860 |
| 207 | 0.50 | 0.51 | 0.010 | 1000 | 7.67 | 2.4E + 11 | 1140 | 48.0 | 1920 |
| 208 | 0.50 | 0.51 | 0.050 | 1000 | 7.69 | 3.6E + 11 | 1180 | 48.2 | 1980 |
| 209 | 0.50 | 0.51 | 0.080 | 1000 | 7.71 | 4.2E + 11 | 1180 | 48.3 | 1990 |
| 210 | 0.50 | 0.51 | 0.100 | 1000 | 7.70 | 4.8E + 11 | 1170 | 48.2 | 2020 |
| 211 | 0.50 | 0.55 | 0.020 | 1000 | 7.68 | 3.5E + 12 | 1130 | 49.0 | 2050 |
| 212 | 0.50 | 0.63 | 0.020 | 1000 | 7.71 | 9.8E + 11 | 1130 | 48.9 | 2120 |

TABLE 17-continued

| Sample No. | Composition | | | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 213 | 0.50 | 0.70 | 0.020 | 1000 | 7.75 | 5.0E + 11 | 1150 | 49.2 | 1990 |
| 214 | 0.50 | 0.75 | 0.020 | 1000 | 7.74 | 9.2E + 11 | 1120 | 48.9 | 1980 |
| 215 | 0.50 | 0.80 | 0.020 | 1000 | 7.75 | 6.8E + 11 | 890 | 48.3 | 1890 |
| 216 | 0.46 | 0.88 | 0.020 | 1000 | 7.72 | 6.9E + 11 | 980 | 50.4 | 1250 |
| 217 | 0.47 | 0.88 | 0.020 | 1000 | 7.73 | 2.4E + 12 | 1320 | 54.3 | 1560 |
| 218 | 0.48 | 0.88 | 0.020 | 1000 | 7.74 | 3.2E + 12 | 1210 | 50.9 | 1800 |
| 219 | 0.49 | 0.88 | 0.020 | 1000 | 7.72 | 8.6E + 11 | 1190 | 47.8 | 2360 |
| 220 | 0.50 | 0.88 | 0.020 | 1000 | 7.70 | 6.8E + 12 | 1150 | 47.1 | 1960 |
| 221 | 0.51 | 0.88 | 0.020 | 1000 | 7.72 | 1.2E + 11 | 1100 | 46.2 | 2040 |
| 222 | 0.50 | 0.90 | 0.020 | 1000 | 7.79 | 2.5E + 11 | 1030 | 43.4 | 2150 |
| 223 | 0.50 | 0.95 | 0.020 | 1000 | 7.73 | 1.9E + 11 | 1000 | 42.8 | 2080 |
| 224 | 0.50 | 0.98 | 0.005 | 1000 | 7.65 | 8.5E + 11 | 1020 | 43.2 | 1890 |
| 225 | 0.50 | 0.98 | 0.050 | 1000 | 7.69 | 1.2E + 11 | 1080 | 44.2 | 1980 |
| 226 | 0.50 | 0.98 | 0.080 | 1000 | 7.71 | 2.4E + 11 | 1090 | 45.2 | 1840 |
| 227 | 0.50 | 0.98 | 0.100 | 1000 | 7.68 | 2.4E + 11 | 1010 | 43.2 | 2020 |
| 228* | 0.50 | 1.00 | 0.020 | 1000 | 7.01 | 6.8E + 08 | 680 | 9.6 | 720 |
| 229*+ | 0.50 | 1.05 | 0.020 | 1000 | 6.82 | 5.4E + 07 | 640 | — | — |

A sample with the sample No. denoted by the mark (*) show that its composition is out of the range of the present invention.

A sample with the sample No. denoted by the mark (+) show that its sintering property is so insufficient that polarization treatment has been impossible. Table 17 shows that good piezoelectric characteristics are obtainable even by firing at a temperature of as low as about 1000C in the piezoelectric ceramic compositions (the sample Nos. 206 to 227) with the molar ratio of Mn/W of larger than 1.0 and smaller than 2.0.

The sintering density was low and piezoelectric characteristics were deteriorated in the samples (the sample Nos. 205 and 228) with the molar ratio of Mn/W of 1.0 or less or 2.0 or more, i.e., z is 0.5 to 1.

EXAMPLE 14

Powders of PbO, TiO$_2$, ZrO$_2$, MnO$_2$, WO$_3$ and SiO$_2$ were blended to be a composition of Pb(Zr$_{1-x}$Ti$_x$)O$_3$+2.0 % by weight of βMnO$_2$+(1-β)WO$_3$+v % by weight of SiO$_2$. Starting material powders of the sample Nos. 230 to 240 shown in Table 18 below were prepared by variously changing the values of x, b and v. The molar ratio z of Mn and W is represented by z=β/2(1-β). Disk-shaped piezoelectric ceramics were obtained by the same method as in Example 1.

Figure 23:
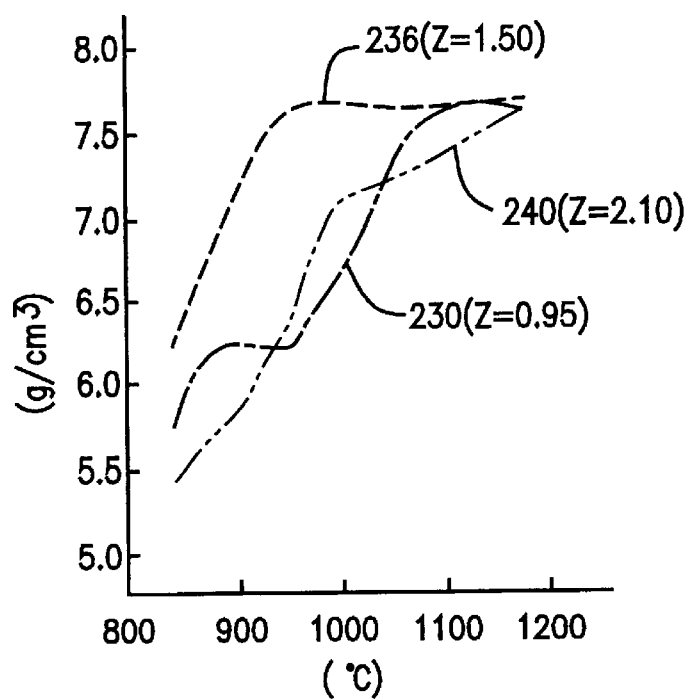
FIG. 23 shows the relation between the firing temperature of the piezoelectric ceramic composition and the sintering density of the piezoelectric member obtained when the molar ratio z of Mn/W in Example 14 is changed.

FIG. 23 shows the relations between the firing temperature and sintering density of the piezoelectric ceramics obtained from each starting material of the sample Nos. 230, 236 and 240 with x=0.5% by weight and v 0.02% by weight as representative examples.

A sufficient sintering density cannot be obtained unless the ceramic is fired at a temperature exceeding 1100° C. in the piezoelectric ceramic composition of the sample No. 230 with the molar ratio Mn/W of 0.95 that is a value of smaller than 1.0. The sintering property is further decreased and a sufficient sintering density cannot be obtained unless the ceramic is fired at a temperature of 1200° C. or more in the composition of the sample No. 240 with the molar ratio Mn/W of 2 or more. The sintering density can be sufficiently enhanced, on the contrary, even by firing at a temperature of as low as 950° C. in the composition of the sample No. 236 with the molar ratio of 1.50.

Accordingly, the sintering property of the piezoelectric ceramic can be largely improved by adjusting the molar ratio Mn/W to be larger than 1.0 and smaller than 2.0, when Mn and W are added as sub-components.

Piezoelectric characteristics were also assessed in Example 14 by polarizing each piezoelectric ceramic after forming electrodes on respective piezoelectric ceramics by the same method as in Example 1. The results are shown in Table 18 below.

TABLE 18

| Sample No. | Composition | | | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 230*+ | 0.50 | 0.48 | 0.050 | 1000 | 6.45 | 7.3E + 07 | 480 | — | — |
| 231* | 0.50 | 0.50 | 0.050 | 1000 | 7.23 | 3.6E + 08 | 770 | 9.6 | 420 |
| 232 | 0.50 | 0.51 | 0.005 | 1000 | 7.62 | 2.3E + 11 | 1100 | 46.2 | 2100 |
| 233 | 0.50 | 0.51 | 0.050 | 1000 | 7.71 | 5.1E + 11 | 1120 | 45.8 | 2120 |
| 234 | 0.50 | 0.51 | 0.100 | 1000 | 7.73 | 6.2E + 11 | 1140 | 44.9 | 2210 |
| 235 | 0.50 | 0.63 | 0.050 | 1000 | 7.73 | 8.3E + 11 | 1100 | 43.2 | 2200 |
| 236 | 0.50 | 0.75 | 0.050 | 1000 | 7.74 | 7.8E + 11 | 1110 | 43.6 | 2190 |
| 237 | 0.50 | 0.88 | 0.050 | 1000 | 7.76 | 8.2E + 11 | 1100 | 43.5 | 2080 |
| 238 | 0.50 | 0.99 | 0.050 | 1000 | 7.74 | 6.3E + 11 | 1070 | 42.9 | 2040 |
| 239* | 0.50 | 1.00 | 0.050 | 1000 | 7.11 | 4.9E + 10 | 890 | 25.1 | 650 |
| 240* | 0.50 | 1.05 | 0.050 | 1000 | 6.82 | 6.3E + 08 | 540 | 9.3 | 120 |

A sample with the sample No. denoted by the mark (*) show that its composition is out of the range of the present invention.

A sample with the sample No. denoted by the mark (+) show that its sintering property is so insufficient that polarization treatment has been impossible. Table 17 clearly shows that good piezoelectric characteristics are obtainable in the compositions (the sample Nos. 232 to 238) with the molar ratio Mn/W of larger than 1.0 and smaller than 2.0.

Good piezoelectric characteristics can not be obtained, on the contrary, when the composition (the sample No. 231) with the molar ratio of 1.00 or less, or the composition (the sample No. 239) with the molar ratio of 2.0 or more is used.

Accordingly, good piezoelectric characteristics can be obtained even by firing at a temperature of as low as about 1000° C. in the piezoelectric ceramic composition with a molar ratio Mn/W of larger than 1.0 and smaller than 2.0.

with the values of 1.0 or less in the composition of the sample Nos. 262 and 263 with the molar ratio of Cr/W of 2.0 or more.

A sufficient sintering density can be obtained, on the contrary, even by firing at a temperature of as low as 940° C. in the composition of the sample No. 248 or 256 with the molar ratio of 1.25 or 1.75, respectively. This is because the boundary between the composition region where the sintering property is improved and the composition range where the sintering property is scarcely improved is so clear that a small change in the composition close to the boundary composition causes a large difference in the sintering property.

Accordingly, the sintering property of the piezoelectric ceramic can be largely improved by adjusting the molar ratio of Cr/W to be larger than 1.0 and smaller than 2.0.

TABLE 19

| Sample No. | Composition | | | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| | x | z | v (% by weight) | | | | | | |
| 241*+ | 0.50 | 0.45 | 0.020 | 950 | 6.48 | 6.2E + 08 | 980 | — | — |
| 242* | 0.50 | 0.50 | 0.020 | 950 | 6.65 | 2.3E + 10 | 1030 | 25.2 | 121 |
| 243 | 0.50 | 0.51 | 0.020 | 950 | 7.63 | 6.4E + 11 | 1060 | 42.5 | 183 |
| 244 | 0.50 | 0.55 | 0.005 | 950 | 7.64 | 7.2E + 11 | 1180 | 42.9 | 188 |
| 245 | 0.50 | 0.55 | 0.020 | 950 | 7.64 | 7.5E + 11 | 1190 | 43.2 | 190 |
| 246 | 0.50 | 0.55 | 0.050 | 950 | 7.69 | 7.8E + 11 | 1180 | 43.0 | 190 |
| 247 | 0.50 | 0.55 | 0.100 | 950 | 7.71 | 8.1E + 11 | 1190 | 43.5 | 200 |
| 248 | 0.50 | 0.63 | 0.020 | 950 | 7.73 | 8.2E + 11 | 1210 | 44.5 | 140 |
| 249 | 0.50 | 0.70 | 0.020 | 950 | 7.76 | 8.6E + 11 | 1220 | 48.2 | 168 |
| 250 | 0.50 | 0.75 | 0.020 | 950 | 7.74 | 9.2E + 11 | 1260 | 47.2 | 216 |
| 251 | 0.50 | 0.80 | 0.020 | 950 | 7.76 | 8.5E + 11 | 1290 | 46.2 | 232 |
| 252 | 0.46 | 0.88 | 0.020 | 950 | 7.72 | 8.0E + 11 | 880 | 49.2 | 299 |
| 253 | 0.47 | 0.88 | 0.020 | 950 | 7.71 | 7.8E + 11 | 1340 | 52.1 | 189 |
| 254 | 0.48 | 0.88 | 0.020 | 950 | 7.70 | 8.6E + 11 | 1280 | 57.4 | 265 |
| 255 | 0.49 | 0.88 | 0.020 | 950 | 7.74 | 5.4E + 11 | 1240 | 55.2 | 312 |
| 256 | 0.50 | 0.88 | 0.020 | 950 | 7.79 | 1.2E + 11 | 1080 | 45.2 | 385 |
| 257 | 0.50 | 0.88 | 0.020 | 950 | 7.74 | 6.5E + 11 | 970 | 42.3 | 428 |
| 258 | 0.50 | 0.90 | 0.020 | 950 | 7.68 | 6.2E + 11 | 1080 | 46.2 | 396 |
| 259 | 0.50 | 0.95 | 0.020 | 950 | 7.60 | 6.2E + 11 | 980 | 46.0 | 285 |
| 260 | 0.50 | 0.98 | 0.020 | 950 | 7.53 | 4.8E + 11 | 980 | 45.6 | 289 |
| 261 | 0.50 | 0.99 | 0.020 | 950 | 7.58 | 4.8E + 11 | 980 | 44.5 | 296 |
| 262* | 0.50 | 1.00 | 0.020 | 950 | 7.42 | 5.6E + 09 | 860 | 22.4 | 97 |
| 263*+ | 0.50 | 1.10 | 0.020 | 950 | 7.01 | 9.2E + 07 | 740 | — | — |

EXAMPLE 15

Powders of PbO, TiO$_2$, ZrO$_2$, Cr$_2$O$_3$, WO$_3$ and SiO$_2$ were blended to be a composition of 0.95Pb(Zr$_{1-x}$Ti$_x$)O$_3$–0.05Pb(Cr$_y$W$_{1-y}$)O$_3$+v % by weight of SiO$_2$ as a starting material. Starting material powders of the sample Nos. 241 to 263 shown in Table 18 below were prepared by variously changing the values of x, y and v. The value z in Table 19, or z=a/(b+c+d+2e) in the present invention, shows the molar ratio of Mn and W and is represented by z=y/2(1−y). Disk-shaped piezoelectric ceramics were obtained by the same method as in Example 1.

Figure 24:
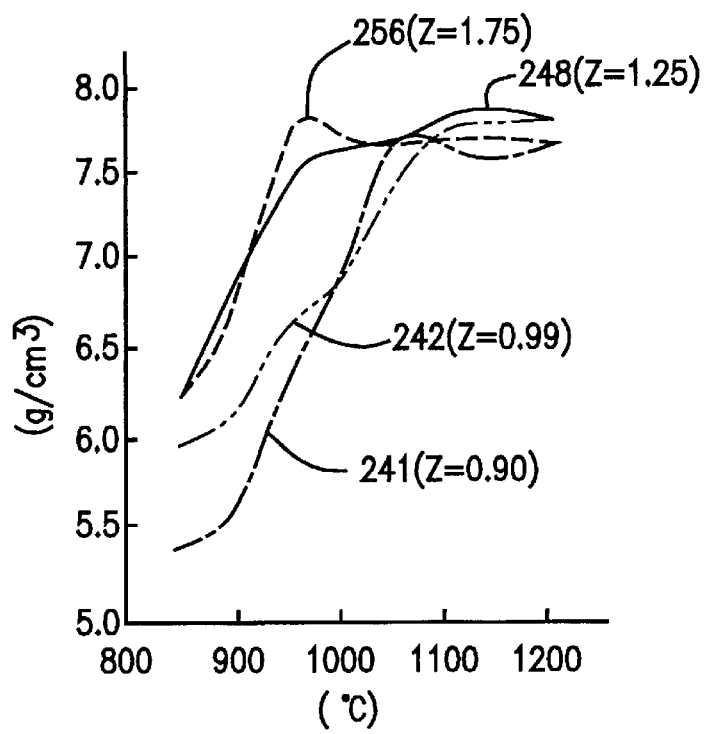
FIG. 24 shows the relation between the firing temperature of the piezoelectric ceramic composition and the sintering density of the piezoelectric member obtained when the molar ratio z of Mn/W in Example 15 is changed.
Figure 25:
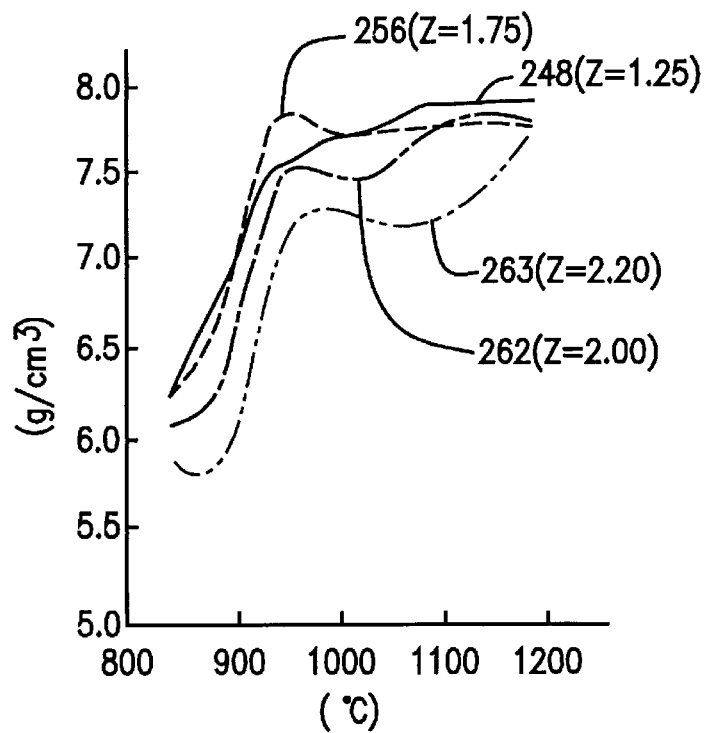
FIG. 25 shows the relation between the firing temperature of the piezoelectric ceramic composition and the sintering density of the piezoelectric member obtained when the molar ratio z of Cr/W in Example 15 is changed.

FIGS. 24 and 25 show the relations between the firing temperature and sintering density of the piezoelectric ceramics obtained in the sample Nos. 241, 242, 248, 256, 262 and 263 with x=0.5% by weight and v=0.02% by weight.

FIG. 24 shows that a sufficient sintering density cannot be obtained unless the ceramic is fired at a temperature exceeding 1200° C. in the sample Nos. 241 and 242 with the molar ratio of Cr/W of 1.0 or less. FIG. 25 also shows that a sufficient sintering density cannot be obtained as well unless the ceramic is fired at a high temperature as in the sample A sample with the sample No. denoted by the mark (*) show that its composition is out of the range of the present invention.

A sample with the sample No. denoted by the mark (+) show that its sintering property is so insufficient that polarization treatment has been impossible.

Table 19 clearly shows that good piezoelectric characteristics are obtainable in the piezoelectric ceramic compositions (the sample Nos. 248 to 261) with the molar ratio of Cr/W of larger than 1.0 and smaller than 2.0.

The sintering density was low and piezoelectric characteristics were deteriorated in the compositions (the sample Nos. 243, 262 and 263) with the molar ratio of Cr/W of 1.0 or less or 2.0 or more.

EXAMPLE 16

PbO, TiO$_2$, ZrO$_2$, Cr$_2$O$_3$, WO$_3$ and SiO2 were blended to be a composition of Pb(Zr$_{1-x}$Ti$_x$)O$_3$+2.0 mol % of {βCr$_2$O$_3$+(1−β)WO$_3$}+v % by weight of SiO$_2$. Starting material powders of the sample Nos. 264 to 276 shown in Table 20 below were prepared by variously changing the values of x, b and v. The molar ratio z of Cr and W, or z=a/(b+c+d+2e)

in the present invention, is represented by $z=\beta/2(1-\beta)$. Disk-shaped piezoelectric ceramics were obtained by the same method as in Example 1.

Figure 26:
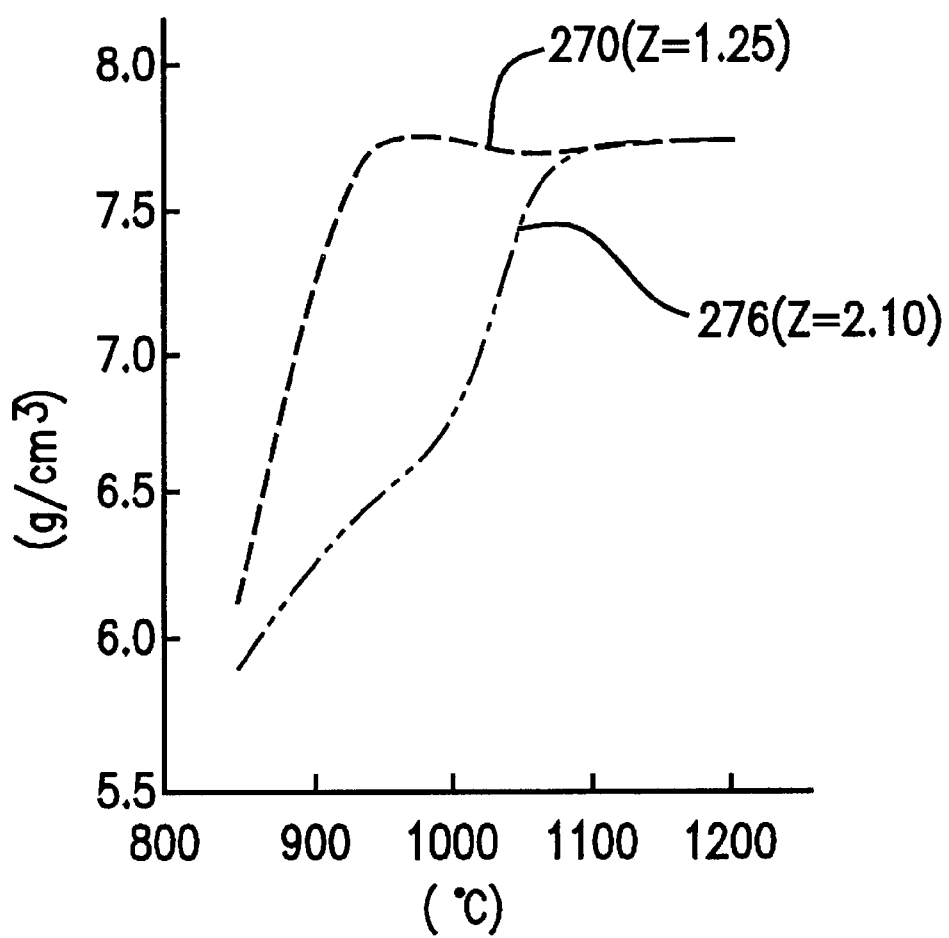
FIG. 26 shows the relation between the firing temperature of the piezoelectric ceramic composition and the sintering density of the piezoelectric member obtained when the molar ratio z of Cr/W in Example 16 is changed.

FIG. 26 shows the relations between the firing temperature and sintering density of the piezoelectric ceramics as representative examples obtained from the compositions of the starting materials of the sample Nos. 270 and 276 with x=0.5% by weight and v=0.02% by weight.

A sufficient sintering density cannot be obtained unless the ceramic is fired at a temperature of as high as 1050° C. in the composition of the sample No. 276 with the molar ratio Cr/W of 2 or more. A sufficient sintering density can be obtained, on the contrary, even by firing at a temperature of as low as 950° C. in the composition of the sample No. 270 with the molar ratio of 1.25.

Accordingly, the sintering property of the piezoelectric ceramic can be largely improved by adjusting the molar ratio to be larger than 1.0 and smaller than 2.0, when Cr and W are added as sub-components in the piezoelectric ceramic composition containing $Pb(Zr_{1-x}Ti_x)O_3$ as a principal component.

Piezoelectric characteristics were also assessed in Example 16 by polarizing each piezoelectric ceramic after forming electrodes on respective piezoelectric ceramics by the same method as in Example 1. The results are shown in Table 20 below.

EXAMPLE 17

$PbO$, $TiO_2$, $ZrO_2$ and $ZrO_2$, and $Cr_2O_3$, $MnO_2$, $Fe_2O_3$ and $CoCO_3$ as Ma oxides, and $Sb_2O_5$, $Nb_2O_3$, $Ta_2O_5$ and $WO_3$ as Md oxides, and $SiO2$ were blended to be a composition of $0.95Pb(Zr_{0.50}Ti_{0.50})O_3-0.05Pb(Ma_aSb_bNb_cTa_dW_e)+v$ % by weight of $SiO_2$ as a starting material. Starting material powders of the sample Nos. 601 to 649 shown in Tables 21 and 22 below were prepared by variously changing the values of v, and a, b, c, d and e. The values of a/(b+c+d+2e) are also shown in Tables 21 and 22.

Water was added in each starting material powder prepared as described above, and the powder was pulverized and mixed with water in a ball-mill in a wet state using cobblestones of stabilized zirconia as a pulverizing medium.

Each starting material powder prepared by mixing as described above was dehydrated by evaporation followed by calcination at a temperature of 700° C. to 900° C.

A PVA (polyvinyl acetate) based binder was added to and mixed with the calcinated starting material in a proportion of 1 to 5% by weight relative to the calcinated starting material.

TABLE 20

| Sample No. | Composition x | z | v (% by weight) | Firing temperature (° C.) | Sintering density (g/cm³) | Resistivity Ω · cm | Relative Dielectric Constant | Electromechanical Coupling Coefficient | Mechanical Quality Coefficient |
|---|---|---|---|---|---|---|---|---|---|
| 264* | 0.50 | 0.50 | 0.020 | 950 | 7.12 | 4.2E + 10 | 1120 | 24.2 | 101 |
| 265* | 0.50 | 0.50 | 0.020 | 950 | 7.23 | 5.8E + 10 | 1130 | 25.1 | 110 |
| 266 | 0.50 | 0.51 | 0.020 | 950 | 7.74 | 6.5E + 11 | 1260 | 48.2 | 252 |
| 267 | 0.50 | 0.55 | 0.020 | 950 | 7.75 | 6.3E + 11 | 1350 | 49.2 | 270 |
| 268 | 0.50 | 0.55 | 0.050 | 950 | 7.76 | 8.9E + 11 | 1360 | 49.0 | 276 |
| 269 | 0.50 | 0.55 | 0.100 | 950 | 7.74 | 9.1E + 11 | 1280 | 48.1 | 245 |
| 270 | 0.50 | 0.63 | 0.020 | 950 | 7.73 | 9.2E + 11 | 1340 | 48.6 | 269 |
| 271 | 0.50 | 0.70 | 0.020 | 950 | 7.72 | 6.4E + 11 | 1280 | 47.6 | 258 |
| 272 | 0.50 | 0.75 | 0.020 | 950 | 7.74 | 7.8E + 11 | 1190 | 46.5 | 280 |
| 273 | 0.50 | 0.88 | 0.020 | 950 | 7.76 | 3.2E + 11 | 1180 | 45.2 | 315 |
| 274 | 0.50 | 0.98 | 0.020 | 950 | 7.70 | 9.2E + 10 | 1090 | 43.2 | 415 |
| 275* | 0.50 | 1.00 | 0.020 | 950 | 7.42 | 8.4E + 09 | 1020 | 23.2 | 79 |
| 276*+ | 0.47 | 1.05 | 0.020 | 950 | 6.54 | 4.6E + 07 | 760 | — | — |

A sample with the sample No. denoted by the mark (*) show that its composition is out of the range of the present invention.

A sample with the sample No. denoted by the mark (+) show that its sintering property is so insufficient that polarization treatment has been impossible.

Table 20 clearly shows that good piezoelectric characteristics are obtainable in the compositions (the sample Nos. 266 to 274) with the molar ratio z of larger than 1.0 and smaller than 2.0.

Sufficient piezoelectric characteristics cannot be obtained when the compositions of the sample Nos. 264 and 265 with the molar ratio Cr/W of 1.0 or less, or the composition of the sample No. 275 with the molar ratio of 2.0 or more is used.

Accordingly, a sufficient piezoelectric characteristics can be obtained even by firing at a temperature of as low as about 1000° C. in the piezoelectric ceramic composition with the molar ratio Cr/W of 1.0 or more and 2.0 or less.

The starting material mixed with the binder as described above was pressed at a pressure of 500 to 2000 Kg/cm² to obtain a disk-shaped molded body. The molded body was then fired at a temperature of 850° C. to 1250° C. to obtain a disk-shaped piezoelectric ceramic with a diameter of 10 mm and a thickness of 1 mm.

After forming silver electrodes on both faces of the piezoelectric ceramic by vacuum evaporation, a direct current electric field of 2.0 kV/mm to 5.0 kV/mm was applied in an insulation oil bath at a temperature of 60° C. to 150° C. in order to polarize the ceramic disk along the direction of thickness, thereby obtaining a disk-shaped piezoelectric resonator.

Piezoelectric characteristics of radial divergent vibration of the piezoelectric resonator obtained was assessed with an impedance analyzer. The results are shown in Tables 21 and 22.

TABLE 21

Composition: $0.95PbZr_{0.50}Ti_{0.50}O_3$-$0.05Pb(Ma_aSb_bNb_cTa_dW_e)O_3$ + v (% by weight) $SiO_2$

| Sample No. | Ma(a) Cr | Ma(a) Mn | Ma(a) Fe | Ma(a) Co | Md b | Md c | Md d | Md e | a/(b + c + d + 2e) | v (% by weight) |
|---|---|---|---|---|---|---|---|---|---|---|
| 601* | 0 | 0.310 | 0 | 0 | 0.690 | 0 | 0 | 0 | 0.45 | 0.000 |
| 602* | 0 | 0.310 | 0 | 0 | 0.690 | 0 | 0 | 0 | 0.45 | 0.005 |
| 603* | 0.310 | 0 | 0 | 0 | 0.690 | 0 | 0 | 0 | 0.45 | 0.000 |
| 604* | 0.329 | 0 | 0 | 0 | 0.671 | 0 | 0 | 0 | 0.49 | 0.020 |
| 605* | 0 | 0.333 | 0 | 0 | 0 | 0 | 0.667 | 0 | 0.50 | 0.000 |
| 606* | 0.329 | 0 | 0 | 0 | 0.671 | 0 | 0 | 0 | 0.49 | 0.000 |
| 607* | 0 | 0.333 | 0 | 0 | 0 | 0.667 | 0 | 0 | 0.50 | 0.020 |
| 608* | 0 | 0.488 | 0 | 0 | 0 | 0 | 0 | 0.512 | 0.48 | 0.005 |
| 609* | 0.488 | 0 | 0 | 0 | 0 | 0 | 0 | 0.512 | 0.48 | 0.020 |
| 610* | 0 | 0 | 0.329 | 0.329 | 0 | 0.671 | 0 | 0 | 0.49 | 0.000 |
| 611* | 0 | 0 | 0 | 0 | 0 | 0 | 0.671 | 0 | 0.49 | 0.000 |
| 612* | 0.083 | 0.083 | 0.083 | 0.083 | 0 | 0.334 | 0 | 0.167 | 0.50 | 0.005 |
| 613 | 0 | 0.338 | 0 | 0 | 0.662 | 0 | 0 | 0 | 0.51 | 0.000 |
| 614 | 0 | 0.338 | 0 | 0 | 0.662 | 0 | 0 | 0 | 0.51 | 0.005 |
| 615 | 0.355 | 0 | 0 | 0 | 0.645 | 0 | 0 | 0 | 0.55 | 0.020 |
| 616 | 0.375 | 0 | 0 | 0 | 0.625 | 0 | 0 | 0 | 0.60 | 0.020 |
| 617 | 0.428 | 0 | 0 | 0 | 0.572 | 0 | 0 | 0 | 0.75 | 0.020 |
| 618 | 0.459 | 0 | 0 | 0 | 0.541 | 0 | 0 | 0 | 0.85 | 0.020 |
| 619 | 0.474 | 0 | 0 | 0 | 0.526 | 0 | 0 | 0 | 0.90 | 0.020 |
| 620 | 0.497 | 0 | 0 | 0 | 0.503 | 0 | 0 | 0 | 0.99 | 0.020 |
| 621 | 0 | 0.338 | 0 | 0 | 0 | 0.662 | 0 | 0 | 0.51 | 0.020 |
| 622 | 0 | 0.355 | 0 | 0 | 0 | 0.645 | 0 | 0 | 0.55 | 0.020 |
| 623 | 0 | 0.375 | 0 | 0 | 0 | 0.625 | 0 | 0 | 0.60 | 0.020 |
| 624 | 0 | 0.428 | 0 | 0 | 0 | 0.572 | 0 | 0 | 0.75 | 0.020 |
| 625 | 0 | 0.459 | 0 | 0 | 0 | 0.541 | 0 | 0 | 0.85 | 0.020 |

| Sample No. | Firing Temperature (° C.) | Sintering Density g/cm$^3$ | Resistivity $\Omega \cdot$ cm | Relative Dielectric Constant | Electromechanical Coupling Coefficient (%) | Mechanical Quality Coefficient |
|---|---|---|---|---|---|---|
| 601* | 1000 | 6.35 | 3.8E + 07 | 480 | — | — |
| 602* | 1000 | 6.45 | 2.8E + 07 | 520 | 14.3 | 280 |
| 603* | 1000 | 6.68 | 5.8E + 07 | 720 | — | — |
| 604* | 1000 | 6.76 | 8.2E + 07 | 950 | 19.5 | 74 |
| 605* | 1000 | 6.91 | 8.2E + 08 | 980 | 15.4 | 280 |
| 606* | 1000 | 6.82 | 5.4E + 07 | 1020 | 20.4 | 58 |
| 607* | 1000 | 6.82 | 5.8E + 08 | 720 | 7.5 | 300 |
| 608* | 1000 | 6.42 | 7.1E + 07 | 490 | — | — |
| 609* | 1000 | 6.65 | 2.3E + 10 | 1030 | 25.2 | 121 |
| 610* | 1000 | 6.31 | 9.0E + 07 | 880 | 13.9 | 86 |
| 611* | 1000 | 6.42 | 1.0E + 08 | 910 | 15.9 | 128 |
| 612* | 1000 | 6.24 | 6.8E + 08 | 420 | — | — |
| 613 | 1000 | 7.70 | 3.8E + 11 | 1100 | 46.8 | 1640 |
| 614 | 1000 | 7.71 | 4.2E + 11 | 1180 | 47.5 | 1840 |
| 615 | 1000 | 7.56 | 8.6E + 11 | 1120 | 38.4 | 140 |
| 616 | 1000 | 7.55 | 8.8E + 11 | 1110 | 53.9 | 138 |
| 617 | 1000 | 7.62 | 9.1E + 11 | 1180 | 48.9 | 174 |
| 618 | 1000 | 7.64 | 9.2E + 11 | 1220 | 47.2 | 170 |
| 619 | 1000 | 7.63 | 9.2E + 11 | 1130 | 45.3 | 412 |
| 620 | 1000 | 7.51 | 4.8E + 11 | 980 | 48.2 | 190 |
| 621 | 1000 | 7.69 | 9.4E + 11 | 1010 | 41.5 | 1920 |
| 622 | 1000 | 7.71 | 6.5E + 11 | 990 | 40.5 | 1850 |
| 623 | 1000 | 7.75 | 7.3E + 11 | 980 | 39.8 | 2350 |
| 624 | 1000 | 7.75 | 6.3E + 11 | 970 | 39.7 | 2340 |
| 625 | 1000 | 7.80 | 1.9E + 12 | 980 | 39.4 | 2300 |

TABLE 22

Composition: $0.95PbZr_{0.50}Ti_{0.50}O_3$-$0.05Pb(Ma_aSb_bNb_cTa_dW_e)O_3$ + v (% by weight) $SiO_2$

| Sample No. | Ma(a) | | | | Md | | | | a/(b + c + d + 2e) | v (% by weight) |
|---|---|---|---|---|---|---|---|---|---|---|
| | Cr | Mn | Fe | Co | b | c | d | e | | |
| 626 | 0 | 0.474 | 0 | 0 | 0 | 0.526 | 0 | 0 | 0.90 | 0.020 |
| 627 | 0 | 0.497 | 0 | 0 | 0 | 0.503 | 0 | 0 | 0.99 | 0.020 |
| 628 | 0 | 0.505 | 0 | 0 | 0 | 0 | 0 | 0.495 | 0.52 | 0.020 |
| 629 | 0 | 0.524 | 0 | 0 | 0 | 0 | 0 | 0.476 | 0.55 | 0.020 |
| 630 | 0 | 0.655 | 0 | 0 | 0 | 0 | 0 | 0.345 | 0.95 | 0.020 |
| 631 | 0.600 | 0 | 0 | 0 | 0 | 0 | 0 | 0.400 | 0.75 | 0.020 |
| 632 | 0.636 | 0 | 0 | 0 | 0 | 0 | 0 | 0.364 | 0.87 | 0.020 |
| 633 | 0 | 0 | 0.428 | 0 | 0.572 | 0 | 0 | 0 | 0.75 | 0.020 |
| 634 | 0 | 0 | 0 | 0.428 | 0.572 | 0 | 0 | 0 | 0.75 | 0.020 |
| 635 | 0 | 0 | 0 | 0.600 | 0 | 0 | 0 | 0.400 | 0.75 | 0.020 |
| 636 | 0.200 | 0.228 | 0 | 0 | 0.300 | 0 | 0 | 0.272 | 0.51 | 0.020 |
| 637 | 0.200 | 0.228 | 0 | 0 | 0 | 0.300 | 0 | 0.272 | 0.51 | 0.020 |
| 638 | 0 | 0.428 | 0 | 0 | 0.286 | 0.286 | 0 | 0 | 0.75 | 0.020 |
| 639 | 0 | 0.450 | 0 | 0 | 0 | 0.300 | 0 | 0.250 | 0.56 | 0.020 |
| 640 | 0.000 | 0.500 | 0 | 0 | 0.300 | 0 | 0 | 0.200 | 0.71 | 0.020 |
| 641* | 0.500 | 0 | 0 | 0 | 0.500 | 0 | 0 | 0 | 1.00 | 0.020 |
| 642* | 0 | 0.500 | 0 | 0 | 0.500 | 0 | 0 | 0 | 1.00 | 0.020 |
| 643* | 0 | 0.524 | 0 | 0 | 0.476 | 0 | 0 | 0 | 1.10 | 0.020 |
| 644* | 0.500 | 0 | 0 | 0 | 0 | 0 | 0.500 | 0 | 1.00 | 0.020 |
| 645* | 0 | 0.524 | 0 | 0 | 0 | 0 | 0.476 | 0 | 1.10 | 0.020 |
| 646* | 0 | 0.500 | 0 | 0 | 0 | 0.500 | 0 | 0 | 1.00 | 0.020 |
| 647* | 0.535 | 0 | 0 | 0 | 0 | 0.465 | 0 | 0 | 1.15 | 0.020 |
| 648* | 0.667 | 0 | 0 | 0 | 0 | 0 | 0 | 0.333 | 1.00 | 0.020 |
| 649* | 0 | 0.667 | 0 | 0 | 0 | 0 | 0 | 0.333 | 1.00 | 0.020 |

| Sample No. | Firing Temperature (° C.) | Sintering Density g/cm³ | Resistivity Ω · cm | Relative Dielectric Constant | Electromechanical Coupling Coefficient (%) | Mechanical Quality Coefficient |
|---|---|---|---|---|---|---|
| 626 | 1000 | 7.83 | 4.2E + 11 | 980 | 38.6 | 2370 |
| 627 | 1000 | 7.59 | 4.1E + 11 | 920 | 37.9 | 2200 |
| 628 | 1000 | 7.67 | 2.4E + 11 | 1140 | 48.0 | 1920 |
| 629 | 1000 | 7.68 | 3.5E + 12 | 1130 | 49.0 | 2050 |
| 630 | 1000 | 7.73 | 1.9E + 11 | 1000 | 42.8 | 2080 |
| 631 | 1000 | 7.76 | 8.6E + 11 | 1220 | 48.2 | 168 |
| 632 | 1000 | 7.79 | 1.2E + 11 | 1080 | 45.2 | 385 |
| 633 | 1000 | 7.58 | 1.5E + 11 | 1010 | 44.8 | 205 |
| 634 | 1000 | 7.61 | 3.9E + 11 | 1140 | 42.5 | 580 |
| 635 | 1000 | 7.69 | 9.2E + 11 | 980 | 40.9 | 625 |
| 636 | 1000 | 7.58 | 8.7E + 11 | 850 | 42.8 | 480 |
| 637 | 1000 | 7.59 | 9.2E + 11 | 840 | 41.5 | 500 |
| 638 | 1000 | 7.74 | 8.2E + 11 | 880 | 38.2 | 1920 |
| 639 | 1000 | 7.77 | 6.9E + 11 | 920 | 40.2 | 1820 |
| 640 | 1000 | 7.78 | 7.1E + 11 | 900 | 39.2 | 2020 |
| 641* | 1000 | 7.42 | 3.2E + 09 | 980 | 28.9 | 75 |
| 642* | 1000 | 7.48 | 9.8E + 10 | 920 | 18.5 | 350 |
| 643* | 1000 | 6.78 | 7.6E + 08 | 680 | 9.6 | 540 |
| 644* | 1000 | 7.52 | 3.2E + 09 | 960 | 27.4 | 101 |
| 645* | 1000 | 6.82 | 8.5E + 08 | 840 | 14.8 | 380 |
| 646* | 1000 | 7.54 | 8.2E + 11 | 890 | 22.5 | 140 |
| 647* | 1000 | 6.52 | 7.4E + 06 | 540 | — | — |
| 648* | 1000 | 7.42 | 5.6E + 09 | 860 | 22.4 | 97 |
| 649* | 1000 | 7.01 | 6.8E + 08 | 680 | 9.6 | 720 |

A sample with the sample No. denoted by the mark (*) show that its composition is out of the range of the present invention.

A sample with the sample No. denoted by the mark (+) show that its sintering property is so insufficient that polarization treatment has been impossible.

Tables 21 and 22 clearly show that good piezoelectric characteristics can be obtained even by firing at a temperature of as low as 1000° C. in the piezoelectric ceramic compositions (the sample Nos. 613 to 640) with the molar ratio a/(b+c+d+2e) of Ma/Md of larger than 0.50 and smaller than 1.00.

The sintering density was low and piezoelectric characteristics were deteriorated in the compositions (the sample Nos. 601 to 612 and 641 to 649) with the molar ratio a/(b+c+d+2e) of Ma/Md of 0.50 or less or 1.00 or more.

EXAMPLE 18

PbO, $TiO_2$, $ZrO_2$, $Cr_2O_3$, $Sb_2O_5$ and $SiO_2$ were blended to be a composition of $0.95Pb_u(Zr_{0.5}Ti_{0.5})O_3$–$0.05Pb_u(Cr_{0.173}Sb_{0.627})O_3$+$0.02SiO_2$. Starting material powders of the sample Nos. 650 to 657 shown in Table 23 below were prepared by variously changing the value of u. Disk-shaped piezoelectric ceramics were manufactured by the same method as in Example 17 using these starting material powders.

Piezoelectric characteristics were also assessed in Example 18 by polarizing each piezoelectric ceramic after forming electrodes on respective piezoelectric ceramics by the same method as in Example 17. The results are shown in Table 23 below.

TABLE 23

Composition: $0.95Pb_uZr_{0.50}Ti_{0.50}O_3\text{-}0.05Pb_u(Cr_{0.473}Sb_{0.527})O_3 + 0.02\ v$ (% by weight) $SiO_2$

| Sample No. | u | Ma(a) Cr | Mn | Fe | Co | Md b | c | d | e | v (% by weight) | a/ (b + c + d + 2e) |
|---|---|---|---|---|---|---|---|---|---|---|---|
| 650 | 0.95 | 0.474 | 0 | 0 | 0 | 0.526 | 0 | 0 | 0 | 0.020 | 0.90 |
| 651 | 0.97 | 0.474 | 0 | 0 | 0 | 0.526 | 0 | 0 | 0 | 0.020 | 0.90 |
| 652 | 0.98 | 0.474 | 0 | 0 | 0 | 0.526 | 0 | 0 | 0 | 0.020 | 0.90 |
| 653 | 1.00 | 0.474 | 0 | 0 | 0 | 0.526 | 0 | 0 | 0 | 0.020 | 0.90 |
| 654 | 1.01 | 0.474 | 0 | 0 | 0 | 0.526 | 0 | 0 | 0 | 0.020 | 0.90 |
| 655 | 1.02 | 0.474 | 0 | 0 | 0 | 0.526 | 0 | 0 | 0 | 0.020 | 0.90 |
| 656 | 1.03 | 0.474 | 0 | 0 | 0 | 0.526 | 0 | 0 | 0 | 0.020 | 0.90 |
| 657 | 1.05 | 0.474 | 0 | 0 | 0 | 0.526 | 0 | 0 | 0 | 0.020 | 0.90 |

| Sample No. | Firing Temperature (° C.) | Sintering Density g/cm³ | Resistivity Ω · cm | Relative Dielectric Constant | Electromechanical Coupling Coefficient (%) | Mechanical Quality Coefficient |
|---|---|---|---|---|---|---|
| 650 | 1000 | 7.32 | 9.1E + 09 | 890 | 38.2 | 321 |
| 651 | 1000 | 7.48 | 2.9E + 10 | 980 | 39.1 | 345 |
| 652 | 1000 | 7.58 | 8.5E + 11 | 1100 | 44.8 | 398 |
| 653 | 1000 | 7.63 | 9.2E + 11 | 1130 | 45.3 | 412 |
| 654 | 1000 | 7.64 | 9.4E + 11 | 1130 | 45.2 | 423 |
| 655 | 1000 | 7.65 | 8.2E + 11 | 1150 | 45.0 | 400 |
| 656 | 1000 | 7.72 | 6.5E + 10 | 1100 | 40.2 | 385 |
| 657 | 1000 | 7.68 | 8.6E + 09 | 1090 | 39.8 | 311 |

Table 23 clearly shows that better piezoelectric characteristics were obtained in the samples of the sample Nos. 652 to 655 with the value u of within a range of 0.98 to 1.02.

EXAMPLE 19

PbO, $TiO_2$, $ZrO_3$, $MnO_2$, $Nb_2O3$ and $SiO_2$ were blended to be a composition of $0.95Pb(Zr_{1-x}Ti_x)O_3\text{-}0.05Pb(Mn_{0.473}Nb_{0.527})O_3+v$ % by weight of $SiO_2$ as a starting material. Starting material powders of the sample Nos. 661 to 674 shown in Table 24 below were prepared by variously changing the value of x. Disk-shaped piezoelectric ceramics were obtained and their piezoelectric characteristics were assessed by the same method as in Example 17.

TABLE 24

Composition: $0.95PbZr_{(1-x)}Ti_{x0}O_3\text{-}0.05Pb(Mn_{0.473}Nb_{0.527})O_3 + 0.02\ v$ (% by weight) $SiO_2$

| Sample No. | x | Ma(a) Cr | Mn | Fe | Co | Md b | c | d | e | v (% by weight) | a/ (b + c + d + 2e) |
|---|---|---|---|---|---|---|---|---|---|---|---|
| 660 | 0.40 | 0 | 0.474 | 0 | 0 | 0 | 0.526 | 0 | 0 | 0.020 | 0.90 |
| 661 | 0.44 | 0 | 0.474 | 0 | 0 | 0 | 0.526 | 0 | 0 | 0.020 | 0.90 |
| 662 | 0.45 | 0 | 0.474 | 0 | 0 | 0 | 0.526 | 0 | 0 | 0.020 | 0.90 |
| 663 | 0.46 | 0 | 0.474 | 0 | 0 | 0 | 0.526 | 0 | 0 | 0.020 | 0.90 |
| 664 | 0.47 | 0 | 0.474 | 0 | 0 | 0 | 0.526 | 0 | 0 | 0.020 | 0.90 |
| 665 | 0.48 | 0 | 0.474 | 0 | 0 | 0 | 0.526 | 0 | 0 | 0.020 | 0.90 |
| 666 | 0.49 | 0 | 0.474 | 0 | 0 | 0 | 0.526 | 0 | 0 | 0.020 | 0.90 |
| 667 | 0.50 | 0 | 0.474 | 0 | 0 | 0 | 0.526 | 0 | 0 | 0.020 | 0.90 |
| 668 | 0.51 | 0 | 0.474 | 0 | 0 | 0 | 0.526 | 0 | 0 | 0.020 | 0.90 |
| 669 | 0.52 | 0 | 0.474 | 0 | 0 | 0 | 0.526 | 0 | 0 | 0.020 | 0.90 |
| 670 | 0.55 | 0 | 0.474 | 0 | 0 | 0 | 0.526 | 0 | 0 | 0.020 | 0.90 |
| 671 | 0.60 | 0 | 0.474 | 0 | 0 | 0 | 0.526 | 0 | 0 | 0.020 | 0.90 |

TABLE 24-continued

Composition: $0.95PbZr_{(1-x)}Ti_{x0}O_3\text{-}0.05Pb(Mn_{0.473}Nb_{0.527})O_3 + 0.02$ v (% by weight) $SiO_2$

| | | | | | | | | | | | |
|---|---|---|---|---|---|---|---|---|---|---|---|
| 672 | 0.65 | 0 | 0.474 | 0 | 0 | 0 | 0.526 | 0 | 0 | 0.020 | 0.90 |
| 673 | 0.66 | 0 | 0.474 | 0 | 0 | 0 | 0.526 | 0 | 0 | 0.020 | 0.90 |
| 674 | 0.67 | 0 | 0.474 | 0 | 0 | 0 | 0.526 | 0 | 0 | 0.020 | 0.90 |

| Sample No. | Firing Temperature (° C.) | Sintering Density g/cm³ | Resistivity Ω · cm | Relative Dielectric Constant | Electromechanical Coupling Coefficient (%) | Mechanical Quality Coefficient |
|---|---|---|---|---|---|---|
| 660 | 1000 | 7.54 | 9.8E + 09 | 450 | 35.2 | 890 |
| 661 | 1000 | 7.68 | 1.0E + 10 | 480 | 38.8 | 980 |
| 662 | 1000 | 7.70 | 1.2E + 10 | 540 | 40.2 | 2050 |
| 663 | 1000 | 7.81 | 1.3E + 12 | 680 | 44.2 | 1990 |
| 664 | 1000 | 7.72 | 9.9E + 11 | 880 | 48.6 | 2010 |
| 665 | 1000 | 7.76 | 5.8E + 11 | 1240 | 50.4 | 1870 |
| 666 | 1000 | 7.70 | 1.0E + 12 | 1070 | 42.5 | 1750 |
| 667 | 1000 | 7.83 | 4.2E + 11 | 980 | 38.6 | 2370 |
| 668 | 1000 | 7.74 | 5.5E + 11 | 950 | 38.2 | 2400 |
| 669 | 1000 | 7.85 | 4.8E + 11 | 940 | 36.8 | 2510 |
| 670 | 1000 | 7.72 | 3.8E + 11 | 880 | 34.2 | 2600 |
| 671 | 1000 | 7.75 | 3.8E + 11 | 560 | 32.1 | 2680 |
| 672 | 1000 | 7.76 | 4.6E + 11 | 480 | 30.5 | 2400 |
| 673 | 1000 | 7.85 | 4.2E + 11 | 400 | 28.4 | 2560 |
| 674 | 1000 | 7.71 | 4.0E + 11 | 380 | 16.2 | 1800 |

Table 24 clearly shows that better piezoelectric characteristics can be obtained in the piezoelectric ceramic compositions (the sample Nos. 662 to 672) with the x value of within a range of 0.45 to 0.65 when the ratio of Ti and Zr is represented by x:1−x.

EXAMPLE 20

PbO, $TiO_2$, $ZrO_2$, $MnO_2$, $Nb_2O_3$ and $SiO_2$ were blended to be a composition of $0.95Pb(Zr_{0.5}Ti_{0.5})O_3\text{-}0.05Pb(Mn_{0.338}Nb_{0.662})O_3$+v % by weight of $SiO_2$. Starting material powders of the sample Nos. 680 to 688 shown in Table 25 below were prepared by variously changing the value of v. Disk-shaped piezoelectric ceramics were manufactured by the same method as in Example 17 using these starting material powders. Piezoelectric characteristics were also assessed in Example 20 by polarizing each piezoelectric ceramic after forming electrodes on respective piezoelectric ceramics by the same method as in Example 17. The results are shown in Table 25 below.

TABLE 25

Composition: $0.95PbZr_{0.50}Ti_{0.50}O_3\text{-}0.05Pb(Mn_{0.338}Nb_{0.662})O_3 + v$ (% by weight) $SiO_2$

| Sample No. | Ma(a) | | | | Md | | | | v (% by weight) | a/ (b + c + d + 2e) |
|---|---|---|---|---|---|---|---|---|---|---|
| | Cr | Mn | Fe | Co | b | c | d | e | | |
| 680 | 0 | 0.338 | 0 | 0 | 0 | 0.662 | 0 | 0 | 0.000 | 0.51 |
| 681 | 0 | 0.338 | 0 | 0 | 0 | 0.662 | 0 | 0 | 0.004 | 0.51 |
| 682 | 0 | 0.338 | 0 | 0 | 0 | 0.662 | 0 | 0 | 0.005 | 0.51 |
| 683 | 0 | 0.338 | 0 | 0 | 0 | 0.662 | 0 | 0 | 0.010 | 0.51 |
| 684 | 0 | 0.338 | 0 | 0 | 0 | 0.662 | 0 | 0 | 0.050 | 0.51 |
| 685 | 0 | 0.338 | 0 | 0 | 0 | 0.662 | 0 | 0 | 0.080 | 0.51 |
| 686 | 0 | 0.338 | 0 | 0 | 0 | 0.662 | 0 | 0 | 0.100 | 0.51 |
| 687 | 0 | 0.338 | 0 | 0 | 0 | 0.662 | 0 | 0 | 0.102 | 0.51 |
| 688 | 0 | 0.338 | 0 | 0 | 0 | 0.662 | 0 | 0 | 0.110 | 0.51 |

| Sample No. | Firing Temperature (° C.) | Sintering Density g/cm³ | Resistivity Ω · cm | Relative Dielectric Constant | Electromechanical Coupling Coefficient (%) | Mechanical Quality Coefficient |
|---|---|---|---|---|---|---|
| 680 | 1000 | 7.62 | 8.0E + 10 | 910 | 41.8 | 1540 |
| 681 | 1000 | 7.63 | 1.3E + 11 | 1080 | 42.5 | 1860 |
| 682 | 1000 | 7.71 | 4.2E + 11 | 1180 | 47.5 | 1840 |
| 683 | 1000 | 7.72 | 6.7E + 11 | 1170 | 48.2 | 1780 |
| 684 | 1000 | 7.68 | 8.2E + 11 | 1120 | 48.0 | 1750 |
| 685 | 1000 | 7.68 | 9.2E + 11 | 1150 | 48.2 | 1640 |
| 686 | 1000 | 7.66 | 9.4E + 11 | 1160 | 47.9 | 1820 |
| 687 | 1000 | 7.54 | 8.2E + 11 | 1080 | 40.5 | 1490 |
| 688 | 1000 | 7.46 | 8.5E + 11 | 950 | 38.9 | 1320 |

Table 25 clearly shows that better piezoelectric characteristics can be obtained in the samples of the compositions (the sample Nos. 682 to 686) containing SiO2 in a proportion of 0.005 to 0. 1% by weight.

The piezoelectric ceramic composition according to the present invention comprising an oxide of the perovskite structure contains Pb, Ti, Zr, Ma (Ma represents at least one of Cr, Mn, Fe and Co) and Md (Md represents at least one of Nb, Sb, Ta and W), wherein a represents the total content (in mole) of Ma, and b, c, d and e (in mole) represent the contents of Sb, Nb, Ta and W among the elements Md, respectively, with the relation of 0.50<a/(b+c+d+2e) <1.00. Consequently, the piezoelectric member obtained has an excellent sintering property enough for providing a sufficient sintering density even by firing at a temperature of as low as about 1000° C. besides exhibiting good piezoelectric characteristics.

A smaller amount of Pb is lost by firing since the piezoelectric member can be fired at a low temperature, enabling the piezoelectric member with few distribution of characteristics to be obtained.

Accordingly, use of the piezoelectric ceramic composition according to the present invention allows piezoelectric resonators, piezoelectric transformers and piezoelectric actuators with stable electrical characteristics to be provided.

What is claimed is:

1. A piezoelectric ceramic composition comprising a perovskite structure oxide containing Pb, Ti, Zr, Ma and Md,
   wherein Ma is at least one member selected from the group consisting of Cr, Mn, Fe and Co,
   wherein Md is at least one selected from the group consisting of Nb, Sb, Ta and W,
   wherein z is 0.50<z<1.00 when the total content in moles of Ma is a, and the contents of Sb, Nb, Ta and W in moles are b, c, d and e, respectively, and a/(b+c+d+2e)=z, and wherein Si is present in an amount of about 0.005 to 0.1% by weight as converted into $SiO_2$ relative to the combined amount of Pb, Ti, Zr, Ma and Md.

2. A piezoelectric ceramic composition according to claim 1, wherein the perovskite structure is represented by $A_uBO_3$ and $0.98 \leq u \leq 1.02$, wherein A is Pb or a combination of Pb and Ba, Ca, Sr, La, Nd or Ce, and B is Ti, Zr, Ma and Md.

3. A piezoelectric ceramic composition according to claim 2, wherein the ratio of Ti to Zr is x:(1−x) and $0.45 \leq x \leq 0.65$.

4. A piezoelectric ceramic composition according to claim 3, wherein Ma is Mn or Cr, and wherein one of b through e is greater than 0 and the rest are 0.

5. A piezoelectric ceramic composition according to claim 4, wherein Ma is Mn, c is greater than 0 and z is at least 11/13.

6. A piezoelectric ceramic composition according to claim 1, wherein the ratio of Ti to Zr is x:(1−x) and $0.45 \leq x \leq 0.65$.

7. A piezoelectric ceramic composition according to claim 1, wherein Ma is Mn or Cr, and wherein one of b through e is greater than 0 and the rest are 0.

8. A piezoelectric resonator comprising the piezoelectric ceramic composition according to claim 7.

9. A piezoelectric transformer comprising the piezoelectric ceramic composition according to claim 7.

10. A piezoelectric actuator comprising the piezoelectric ceramic composition according to claim 7.

11. A piezoelectric resonator comprising the piezoelectric ceramic composition according to claim 4.

12. A piezoelectric transformer comprising the piezoelectric ceramic composition according to claim 4.

13. A piezoelectric actuator comprising the piezoelectric ceramic composition according to claim 4.

14. A piezoelectric resonator comprising the piezoelectric ceramic composition according to claim 2.

15. A piezoelectric transformer comprising the piezoelectric ceramic composition according to claim 2.

16. A piezoelectric actuator comprising the piezoelectric ceramic composition according to claim 2.

17. A piezoelectric resonator comprising the piezoelectric ceramic composition according to claim 1.

18. A piezoelectric transformer comprising the piezoelectric ceramic composition according to claim 1.

19. A piezoelectric actuator comprising the piezoelectric ceramic composition according to claim 1.

* * * * *